(12) United States Patent
Narendran et al.

(10) Patent No.: US 7,889,421 B2
(45) Date of Patent: Feb. 15, 2011

(54) HIGH-POWER WHITE LEDS AND MANUFACTURING METHOD THEREOF

(75) Inventors: Nadarajah Narendran, Clifton Park, NY (US); Yimin Gu, Troy, NY (US)

(73) Assignee: Rensselaer Polytechnic Institute, Troy, NY (US)

( * ) Notice: Subject to any disclaimer, the term of this patent is extended or adjusted under 35 U.S.C. 154(b) by 126 days.

(21) Appl. No.: 11/644,815

(22) Filed: Dec. 22, 2006

(65) Prior Publication Data
US 2008/0117500 A1    May 22, 2008

Related U.S. Application Data

(60) Provisional application No. 60/859,633, filed on Nov. 17, 2006.

(51) Int. Cl.
*G02F 2/02* (2006.01)
*G02F 1/35* (2006.01)

(52) U.S. Cl. .................. 359/326; 362/555; 362/558; 359/332

(58) Field of Classification Search .................. 362/26, 362/27, 222, 225, 228, 235, 293, 329, 330, 362/555, 558, 560, 582; 359/326–332
See application file for complete search history.

(56) References Cited

U.S. PATENT DOCUMENTS

| | | | |
|---|---|---|---|
| 3,555,337 A | 1/1971 | Faria et al. |
| 3,581,137 A | 5/1971 | Arnott et al. |
| 3,593,055 A | 7/1971 | Geusie et al. |
| 3,760,237 A | 9/1973 | Jaffe |
| 3,763,405 A | 10/1973 | Mitsuhata |
| 3,875,456 A | 4/1975 | Kano et al. |
| 4,729,076 A | 3/1988 | Masami et al. |
| 5,097,175 A | 3/1992 | Thomas |
| 5,187,765 A | 2/1993 | Muehlemann et al. |
| 5,208,462 A | 5/1993 | O'Connor et al. |
| 5,461,547 A | 10/1995 | Ciupke et al. |
| 5,477,430 A | 12/1995 | LaRosa |
| 5,499,138 A | 3/1996 | Iba |

(Continued)

FOREIGN PATENT DOCUMENTS

DE    3632743 A1    3/1988

(Continued)

OTHER PUBLICATIONS

Search Report from International Application Serial No. PCT/US2007/012311 dated Feb. 15, 2008.

(Continued)

*Primary Examiner*—Daniel Petkovsek
(74) *Attorney, Agent, or Firm*—RatnerPrestia

(57) ABSTRACT

A light emitting apparatus has a radiation source for emitting short wavelength radiation. A down conversion material receives and down converts at least some of the short wavelength radiation emitted by the radiation source and back transfers a portion of the received and down converted radiation. An optic device adjacent the down conversion material at least partially surrounds the radiation source. The optic device is configured to extract at least some of the back transferred radiation. A sealant substantially seals a space between the radiation source and the optic device.

15 Claims, 15 Drawing Sheets

U.S. PATENT DOCUMENTS

| | | | |
|---|---|---|---|
| 5,535,230 A | 7/1996 | Abe | |
| 5,622,423 A | 4/1997 | Lee | |
| 5,711,594 A | 1/1998 | Hay | |
| 5,777,433 A | 7/1998 | Lester et al. | |
| 5,808,409 A | 9/1998 | Matsuda et al. | |
| 5,813,752 A | 9/1998 | Singer et al. | |
| 5,813,753 A * | 9/1998 | Vriens et al. | 362/293 |
| 5,847,507 A | 12/1998 | Butterworth et al. | |
| 5,959,316 A | 9/1999 | Lowery | |
| 5,962,971 A | 10/1999 | Chen | |
| 5,998,925 A | 12/1999 | Shimizu et al. | |
| 6,007,209 A | 12/1999 | Pelka | |
| 6,066,861 A | 5/2000 | Höhn et al. | |
| 6,068,383 A | 5/2000 | Robertson et al. | |
| 6,069,440 A | 5/2000 | Shimizu et al. | |
| 6,084,250 A | 7/2000 | Jüstel et al. | |
| 6,096,496 A | 8/2000 | Frankel | |
| 6,155,699 A | 12/2000 | Miller et al. | |
| 6,210,012 B1 | 4/2001 | Broer | |
| 6,245,259 B1 | 6/2001 | Höhn et al. | |
| 6,252,254 B1 | 6/2001 | Soules et al. | |
| 6,294,800 B1 | 9/2001 | Duggal et al. | |
| 6,350,041 B1 * | 2/2002 | Tarsa et al. | 362/231 |
| 6,357,889 B1 | 3/2002 | Duggal et al. | |
| 6,385,855 B1 | 5/2002 | Tymianski | |
| 6,452,217 B1 | 9/2002 | Wojnarowski et al. | |
| 6,469,322 B1 | 10/2002 | Srivastava et al. | |
| 6,483,196 B1 | 11/2002 | Wojnarowski et al. | |
| 6,491,412 B1 | 12/2002 | Bowman et al. | |
| 6,501,102 B2 | 12/2002 | Mueller-Mach et al. | |
| 6,513,949 B1 | 2/2003 | Marshall et al. | |
| 6,576,930 B2 | 6/2003 | Reeh et al. | |
| 6,576,935 B2 | 6/2003 | Onishi et al. | |
| 6,580,097 B1 | 6/2003 | Soules et al. | |
| 6,580,224 B2 | 6/2003 | Ishii et al. | |
| 6,600,175 B1 | 7/2003 | Baretz et al. | |
| 6,603,258 B1 | 8/2003 | Mueller-Mach et al. | |
| 6,608,332 B2 | 8/2003 | Shimizu et al. | |
| 6,614,170 B2 | 9/2003 | Wang et al. | |
| 6,614,179 B1 | 9/2003 | Shimizu et al. | |
| 6,616,862 B2 | 9/2003 | Srivastava et al. | |
| 6,630,691 B1 | 10/2003 | Mueller-Mach et al. | |
| 6,635,363 B1 | 10/2003 | Duclos et al. | |
| 6,635,987 B1 | 10/2003 | Wojnarowski et al. | |
| 6,653,765 B1 | 11/2003 | Levinson et al. | |
| 6,686,676 B2 | 2/2004 | McNulty et al. | |
| 6,686,691 B1 | 2/2004 | Mueller et al. | |
| 6,692,136 B2 | 2/2004 | Marshall et al. | |
| 6,696,703 B2 | 2/2004 | Mueller-Mach et al. | |
| 6,734,467 B2 | 5/2004 | Schlereth et al. | |
| 6,791,259 B1 | 9/2004 | Stokes et al. | |
| 6,793,374 B2 | 9/2004 | Begemann | |
| 6,796,690 B2 | 9/2004 | Bohlander | |
| 6,799,865 B2 | 10/2004 | Ellens et al. | |
| 6,809,342 B2 * | 10/2004 | Harada | 257/79 |
| 6,833,565 B2 | 12/2004 | Su et al. | |
| 6,867,542 B1 | 3/2005 | Sun et al. | |
| 6,936,857 B2 | 8/2005 | Doxsee et al. | |
| 6,976,762 B2 | 12/2005 | Chien | |
| 7,002,291 B2 | 2/2006 | Ellens et al. | |
| 7,026,656 B2 | 4/2006 | Lin et al. | |
| 7,040,774 B2 | 5/2006 | Beeson et al. | |
| 7,048,385 B2 | 5/2006 | Beeson et al. | |
| 7,049,740 B2 | 5/2006 | Takekuma | |
| 7,052,152 B2 | 5/2006 | Harbers et al. | |
| 7,192,161 B1 | 3/2007 | Cleaver et al. | |
| 7,260,123 B2 * | 8/2007 | Sato | 372/22 |
| 7,498,734 B2 * | 3/2009 | Suehiro et al. | 313/502 |
| 7,517,728 B2 * | 4/2009 | Leung et al. | 438/122 |
| 7,703,942 B2 * | 4/2010 | Narendran et al. | 362/231 |
| 7,837,348 B2 * | 11/2010 | Narendran et al. | 362/231 |
| 2002/0003233 A1 | 1/2002 | Mueller-Mach et al. | |
| 2002/0030444 A1 | 3/2002 | Muller-Mach et al. | |
| 2002/0047516 A1 | 4/2002 | Iwasa et al. | |
| 2002/0084745 A1 | 7/2002 | Wang et al. | |
| 2002/0167014 A1 | 11/2002 | Schlereth et al. | |
| 2003/0030060 A1 | 2/2003 | Okazaki | |
| 2003/0067773 A1 | 4/2003 | Marshall et al. | |
| 2003/0174499 A1 | 9/2003 | Bohlander | |
| 2003/0189829 A1 | 10/2003 | Shimizu et al. | |
| 2003/0201451 A1 | 10/2003 | Suehiro et al. | |
| 2003/0218880 A1 | 11/2003 | Brukilacchio | |
| 2003/0230751 A1 * | 12/2003 | Harada | 257/80 |
| 2004/0016938 A1 | 1/2004 | Baretz et al. | |
| 2004/0056260 A1 | 3/2004 | Slater, Jr. et al. | |
| 2004/0116033 A1 | 6/2004 | Ouderkirk et al. | |
| 2004/0124758 A1 | 7/2004 | Danielson et al. | |
| 2004/0129945 A1 | 7/2004 | Uemura | |
| 2004/0203312 A1 | 10/2004 | Bortscheller et al. | |
| 2004/0208210 A1 | 10/2004 | Inoguchi | |
| 2004/0217364 A1 | 11/2004 | Tarsa | |
| 2004/0233664 A1 | 11/2004 | Beeson et al. | |
| 2004/0263073 A1 | 12/2004 | Baroky et al. | |
| 2004/0263074 A1 | 12/2004 | Baroky et al. | |
| 2005/0041424 A1 | 2/2005 | Ducharme | |
| 2005/0073495 A1 | 4/2005 | Harbers et al. | |
| 2005/0093430 A1 | 5/2005 | Ibbetson et al. | |
| 2005/0116635 A1 | 6/2005 | Walson et al. | |
| 2005/0117125 A1 | 6/2005 | Minano et al. | |
| 2005/0117366 A1 | 6/2005 | Simbal | |
| 2005/0135117 A1 | 6/2005 | Lamb et al. | |
| 2005/0162849 A1 | 7/2005 | Keuper | |
| 2005/0174775 A1 | 8/2005 | Conner | |
| 2005/0185419 A1 | 8/2005 | Holman et al. | |
| 2005/0211991 A1 | 9/2005 | Mori et al. | |
| 2005/0219476 A1 | 10/2005 | Beeson et al. | |
| 2005/0237488 A1 | 10/2005 | Yamasaki et al. | |
| 2005/0248958 A1 | 11/2005 | Li | |
| 2005/0265029 A1 | 12/2005 | Epstein et al. | |
| 2005/0276553 A1 | 12/2005 | Kazakevich et al. | |
| 2005/0280785 A1 | 12/2005 | Beeson et al. | |
| 2006/0002141 A1 | 1/2006 | Ouderkirk et al. | |
| 2006/0007553 A1 | 1/2006 | Bogner | |
| 2006/0034082 A1 | 2/2006 | Park et al. | |
| 2006/0034084 A1 | 2/2006 | Matsuura et al. | |
| 2006/0044523 A1 | 3/2006 | Teijido et al. | |
| 2006/0044803 A1 | 3/2006 | Edwards | |
| 2006/0049416 A1 | 3/2006 | Baretz | |
| 2006/0066192 A1 | 3/2006 | Beeson et al. | |
| 2006/0067078 A1 | 3/2006 | Beeson et al. | |
| 2006/0071225 A1 | 4/2006 | Beeson et al. | |
| 2006/0072314 A1 | 4/2006 | Rains | |
| 2006/0091788 A1 | 5/2006 | Yan | |
| 2006/0097385 A1 | 5/2006 | Negley | |
| 2006/0104090 A1 | 5/2006 | Lengyel et al. | |
| 2006/0118805 A1 | 6/2006 | Camras et al. | |
| 2006/0170335 A1 | 8/2006 | Cho et al. | |
| 2006/0186429 A1 | 8/2006 | Chew | |
| 2006/0202219 A1 | 9/2006 | Ohashi | |

FOREIGN PATENT DOCUMENTS

| | | |
|---|---|---|
| EP | 1 160 883 A | 12/2001 |
| EP | 1 686 630 A | 8/2006 |
| EP | 1 691 425 A | 8/2006 |
| EP | 1 696 496 A | 8/2006 |
| JP | 2001-243807 | 9/2001 |
| JP | 2001-243821 | 9/2001 |
| JP | 2002-299694 | 10/2002 |
| JP | 2004-055160 | 2/2004 |
| JP | 2004-055229 | 2/2004 |
| WO | WO 00/24064 A | 4/2000 |
| WO | WO 01/40702 A1 | 6/2001 |
| WO | WO 2005/107420 | 11/2005 |

| | | |
|---|---|---|
| WO | WO 2006/087651 | 8/2006 |

OTHER PUBLICATIONS

Akos Borbely, et al., Prediction of Light Extraction Efficiency of LEDs by Ray Trace Simulation, Third International Conference on Solid State Lighting, Proc. of SPIE vol. 5187, pp. 301-308.

Song Jae Lee, Study of Photon Extraction Efficiency in InGaN Light-Emitting Diodes Depending on Chip Structures and Chip-Mount Schemes, Optical Engineering, Jan. 2006, vol. 45(1), pp. 014601-1-014601-14.

D.A. Vanderwater et al., High-Brightness AlGaInP Light Emitting Diodes, Proceedings of the IEE, vol. 85, No. 11, Nov. 1997, pp. 1752-1764.

Kenichi Yamada et al., Optical Simulation of Light Source Devices Composed of Blue LEDs and YAG Phosphor, J. Light & Vis. Env. vol. 27, No. 2, 2003, pp. 70-74.

N. Narendran et al., Solid-state Lighting: failure analysis of white LEDs, Journal of Crystal Growth, 268 (2004) pp. 449-456.

M. Arik et al., Effects of Localized Heat Generations Due to the Color Conversion in Phosphor Particles and Layers of High Brightness Light Emitting Diodes, American Society of Mechanical Engineers (ASME), Proceedings of InterPACK '03, International Electronic Packaging Technical Conference and Exhibition, Maui, Hawaii, Jul. 2003, pp. 1-9, title page, copyright page and abstract page.

International Search Report of PCT International Application No. PCT/US2005/015736 dated Feb. 27, 2006 (3 pages).

Kim J.K. et al: "Strongly Enhanced Phosphor Efficiency in GaInN White Light-Emitting Diodes Using Remote Phosphor configuration and Diffuse Reflector Cup" Japanese Journal of Applied Physics, Part 2 (Letters) Japan Soc. Appl. Phys Japan, vol. 44, No. 20-23, 2005, pp. L649-L651.

Search Report for International Application Serial No. PCT/US2007013132 dated Dec. 3, 2007.

First Office Action for Chinese Application No. 2005800222839 dated Jul. 8, 2008 (including English translation).

United States Patent and Trademark Office Office Action for U.S. Appl. No. 11/642,089 dated May 28, 2008.

United States Patent and Trademark Office Office Action for U.S. Appl. No. 11/642,154 dated Sep. 25, 2008.

European Search Report of Application No. EP 05 76 1021 dated Jun. 18, 2008.

United States Patent and Trademark Office Office Action for U.S. Appl. No. 10/583,105 dated Nov. 4, 2008.

Krames M.R. et al.: "High-power III-nitride emitters for solid-state lighting" Physica Status Solidi A Wiley-VCH Germany, vol. 192, No. 2, Aug. 2002, pp. 237-245.

Search Report for International Application Serial No. PCT/US2007/013132 dated Jan. 31, 2008.

United States Patent and Trademark Office Office Action for U.S. Appl. No. 11/642,089 dated Mar. 10, 2009.

United States Patent and Trademark Office Office Action in U.S. Appl. No. 10/583,105 dated Jun. 19, 2009.

United States Patent and Trademark Office Office Action in U.S. Appl. No. 11/642,154 dated Jun. 2, 2009.

English language translation of the Third Office Action in Chinese Patent Application No. 200580022283.9 mailed on Jan. 22, 2010.

USPTO Office Action in U.S. Appl. No. 11/642,089 dated Jul. 23, 2009.

European Office Action in EP Application No. 05 761 021.4 dated Oct. 8, 2009.

U.S. Office Action for U.S. Appl. No. 10/583,105 mailed on Apr. 12, 2010.

U.S. Office Action for U.S. Appl. No. 11/642,089 mailed on Apr. 9, 2010.

\* cited by examiner

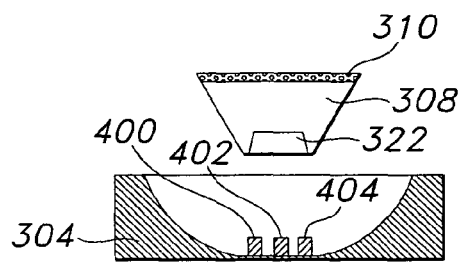
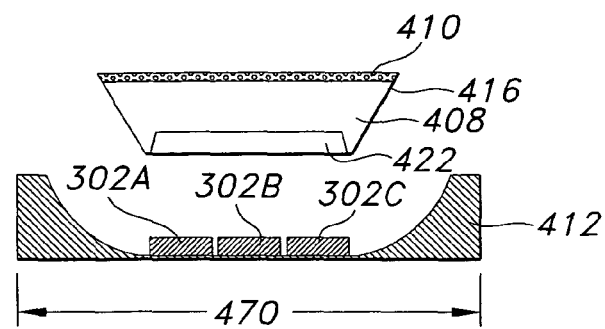
FIG. 10        FIG. 11
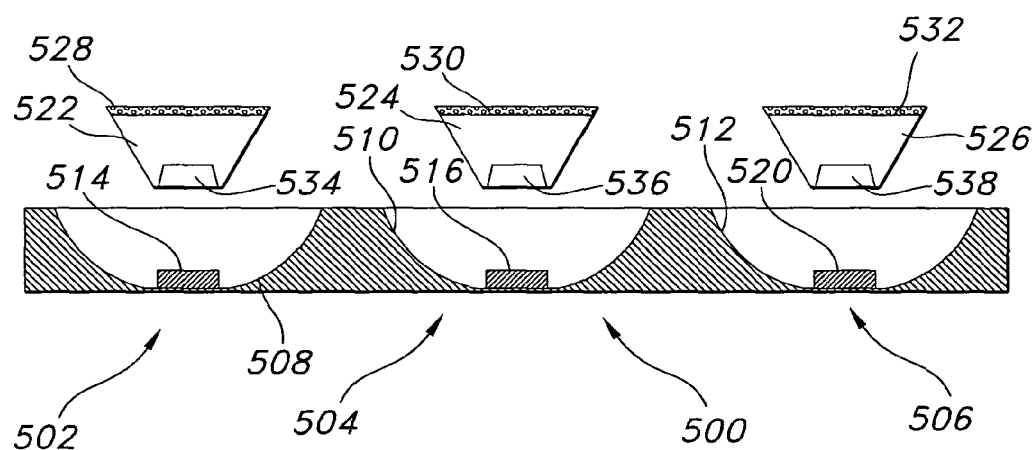
FIG. 12

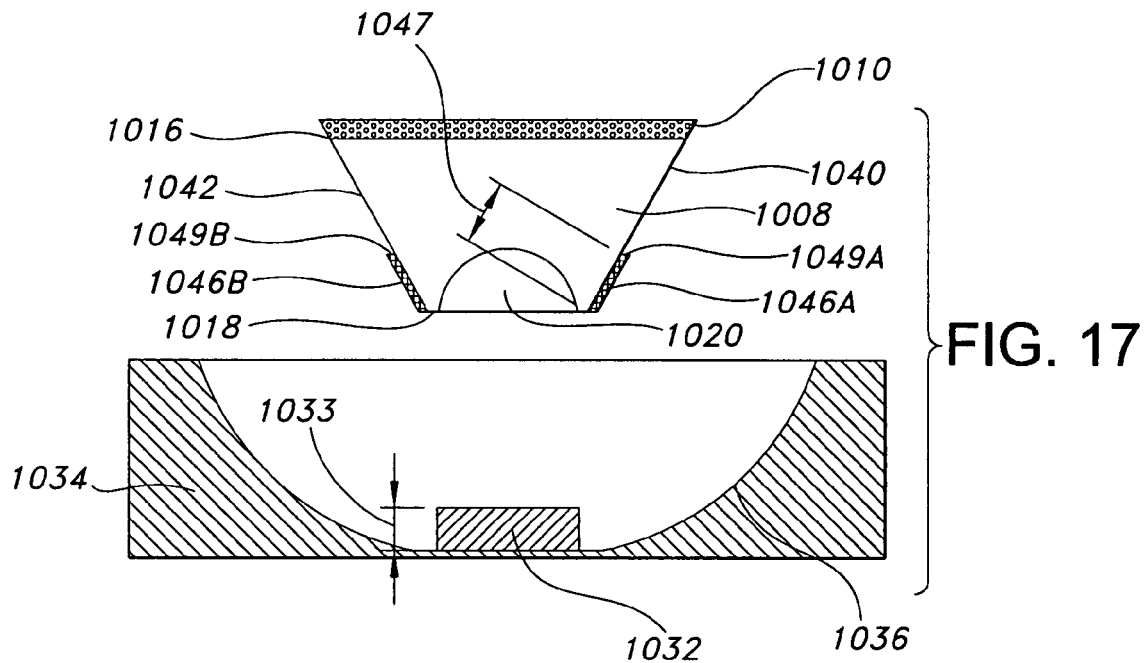
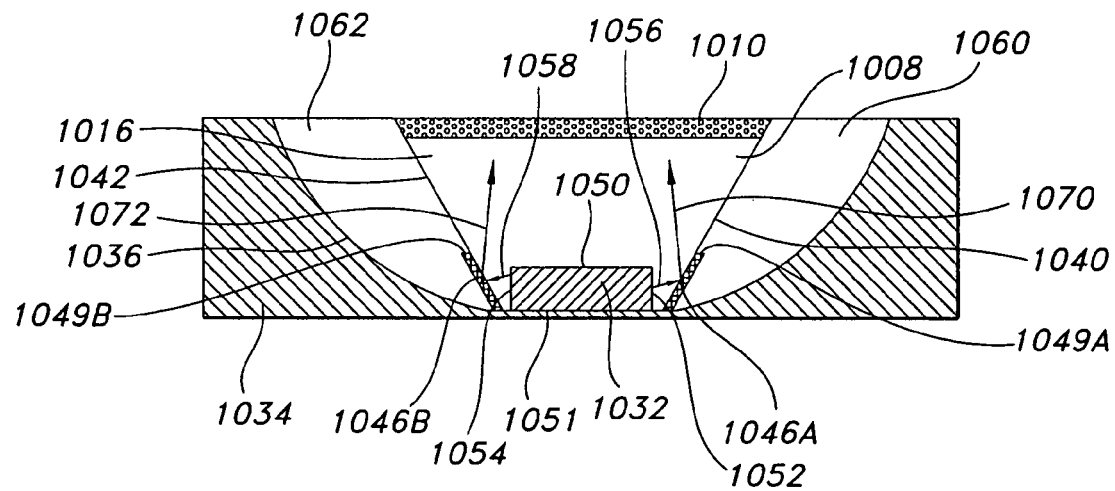
FIG. 17
FIG. 18

HIGH-POWER WHITE LEDS AND MANUFACTURING METHOD THEREOF

CROSS REFERENCE TO RELATED APPLICATION

This application claims the benefit of priority to U.S. Provisional Application Ser. No. 60/859,633 filed Nov. 17, 2006, the contents of which is incorporated by reference herein.

BACKGROUND OF THE INVENTION

Solid state light emitting devices, including solid state lamps having light emitting diodes (LEDs) and resonant cavity LEDs (RCLEDs) are extremely useful, because they potentially offer lower fabrication costs and long term durability benefits over conventional incandescent and fluorescent lamps. Due to their long operation (burn) time and low power consumption, solid state light emitting devices frequently provide a functional cost benefit, even when their initial cost is greater than that of conventional lamps. Because large scale semiconductor manufacturing techniques may be used, many solid state lamps may be produced at extremely low cost.

In addition to applications such as indicator lights on home and consumer appliances, audio visual equipment, telecommunication devices and automotive instrument markings, LEDs have found considerable application in indoor and outdoor informational displays.

With the development of efficient LEDs that emit short wavelength (e.g., blue or ultraviolet (UV)) radiation, it has become feasible to produce LEDs that generate white light through down conversion (i.e., phosphor conversion) of a portion of the primary emission of the LED to longer wavelengths. Conversion of primary emissions of the LED to longer wavelengths is commonly referred to as down-conversion of the primary emission. An unconverted portion of the primary emission combines with the light of longer wavelength to produce white light.

Phosphor conversion of a portion of the primary emission of the LED is attained by placing a phosphor layer in an epoxy that is used to fill the reflector cup which houses the LED within the LED lamp. The phosphor is in the form of a powder that is mixed into the epoxy prior to curing the epoxy. The uncured epoxy slurry containing the phosphor powder is then deposited onto the LED and subsequently cured.

The phosphor particles within the cured epoxy generally are randomly oriented and interspersed throughout the epoxy. A portion of the primary light emitted by the LED passes through the epoxy without impinging on the phosphor particles, and another portion of the primary radiation emitted by the LED chip impinges on the phosphor particles, causing the phosphor particles to emit longer wavelength radiation. The combination of the primary short wavelength radiation and the phosphor-emitted radiation produces white light.

Current state of the art phosphor-converted LED (pc-LED) technology is inefficient in the visible spectrum. The light output for a single pc-white LED is below that of typical household incandescent lamps, which are approximately 10 percent efficient in the visible spectrum. An LED device having a light output that is comparable to a typical incandescent lamp's power density necessitates a larger LED chip or a design having multiple LED chips. Moreover, a form of direct energy absorbing cooling must be incorporated to handle the temperature rise in the LED device itself. More particularly, the LED device becomes less efficient when heated to a temperature greater than 100° C., resulting in a declining return in the visible spectrum. The intrinsic phosphor conversion efficiency, for some phosphors, drops dramatically as the temperature increases above approximately 90° C. threshold.

A conventional LED chip is encapsulated by an epoxy that may be referred to as a dome or an epoxy dome. Light from the encapsulated LED passes through the encapsulating substance of the dome before passing through a transmission medium, such as air. The encapsulating substance of the dome performs at least two functions. First, allows for beam control; i.e., it helps to control the direction of light rays passing from the LED chip to a destination. Second, it increases the efficiency of light transmission between the LED and air. The encapsulating substance of the dome performs these two functions at least in part because the value of the refractive index of the encapsulating medium is between the refractive index of the LED chip and the refractive index of air. In a conventional LED chip, the height of the dome may be in the range of 2 mm to 10 mm.

SUMMARY OF THE INVENTION

An embodiment of this invention is a light emitting apparatus having a radiation source for emitting short wavelength radiation. A down conversion material receives and down converts at least some of the short wavelength radiation emitted by the radiation source and back transfers a portion of the received and down converted radiation. An optic device adjacent the down conversion material at least partially surrounds the radiation source. The optic device is configured to extract at least some of the back transferred radiation. A sealant substantially seals a space between the radiation source and the optic device.

Another embodiment of the invention is a light emitting apparatus having a plurality of radiation sources for emitting short wavelength radiation. A down conversion material receives and down converts at least some of the short wavelength radiation from at least one of the plurality of radiation sources and back transfers a portion of the received and down converted radiation. An optic device adjacent the down conversion material at least partially surrounds the plurality of radiation sources and is configured to extract at least some of the radiation back transferred from the down conversion material. A sealant substantially seals a space between the plurality of radiation sources and the optic device.

Still another embodiment of the invention is a light emitting apparatus having a plurality of radiation sources for emitting short wavelength radiation. A plurality of down conversion material layers respectively receives and down converts at least some of the short wavelength radiation emitted by respective ones of the radiation sources and back transfers respective portions of the respectively received and down converted radiation. There are a plurality of optic devices. Respective optic devices are adjacent respective down conversion material layers. Respective ones of the optic devices at least partially surround respective ones of the radiation sources. Respective optic devices are each configured to extract at least some of the radiation back transferred from respective down conversion material layers or radiation from respective radiation sources. A plurality of sealants substantially seal respective spaces between respective radiation sources and respective optic devices.

Another embodiment of the invention is a method of manufacturing a light emitting apparatus. A down conversion material is placed on a first portion of an optic device that is configured to extract at least one of radiation back transferred from the down conversion material or radiation emitted from a short wavelength radiation source. An aperture is formed in a second portion of the optic device. A sealant is placed on a surface of the second portion of the optic device. The radiation source is inserted into the aperture wherein at least one surface of the radiation source contacts the sealant. The optic device is placed on a support.

Another embodiment of the invention is another method of manufacturing a light emitting apparatus. A down conversion material is placed on a first portion of an optic device that is configured to extract at least one of radiation back transferred from the down conversion material or radiation emitted from a short wavelength radiation source. An aperture is formed in a second portion of the optic device. A sealant is placed on a surface of the second portion of the optic device inside the aperture. The radiation source is placed on a support. The optic device is placed onto the support and over the radiation source so that the optic device at least partially surrounds the radiation source.

Yet another embodiment of the invention is a light emitting apparatus having a radiation source for emitting short wavelength radiation. A down conversion material receives and down converts at least some of the short wavelength radiation emitted by the radiation source and back transfers a portion of the received and down converted radiation. An optic device adjacent the down conversion material and the radiation source is configured to extract from the optic device at least one of back-transferred radiation or radiation from the radiation source. A first reflective surface at least partially surrounds the optic device for reflecting at least some of the light extracted from the optic device. A second reflective surface at least partially surrounds the radiation source for reflecting at least some of the radiation emitted by the radiation source.

Still another embodiment of the invention is a light emitting apparatus having a plurality of radiation sources for emitting short wavelength radiation. A down conversion material receives and down converts at least some of the short wavelength radiation from at least one of the plurality of radiation sources and back transfers a portion of the received and down converted radiation. An optic device adjacent the down conversion material at least partially surrounds the plurality of radiation sources and is configured to extract at least some of the radiation that is back transferred from the down conversion material. A sealant substantially seals a space between the plurality of radiation sources and the optic device.

Another embodiment of the invention is another method of manufacturing a light emitting apparatus having a first reflective cup and a second reflective cup. A down conversion material is placed on a first portion of an optic device that is configured to extract one of radiation back transferred from the down conversion material or radiation emitted from a short wavelength radiation source. A first surface of the radiation source is placed on a first surface of a well that is formed by the second reflective cup. A first sealant is placed between at least a second surface of the radiation source and a second surface of the well. A second sealant is placed on at least a third surface of the radiation source. The optic device is placed within the first reflective cup and in contact with the second sealant.

BRIEF DESCRIPTION OF THE DRAWINGS

It will be understood that the figures are not drawn to scale and that the relative size of certain features may be exaggerated for ease of illustration.

FIG. 10 is another embodiment of the invention wherein a plurality of short wavelength radiation sources are used;

FIG. 11 is another embodiment of the invention having a plurality of short wavelength radiation sources;

FIG. 12 is yet another embodiment of the invention having a plurality of short wavelength radiation sources;

FIG. 17 is a partial cross-section view of an optic device in accordance with still another embodiment of the invention;

FIG. 18 is another partial cross-section view of the embodiment illustrated in FIG. 17;

DETAILED DESCRIPTION OF THE INVENTION

Figure 1:
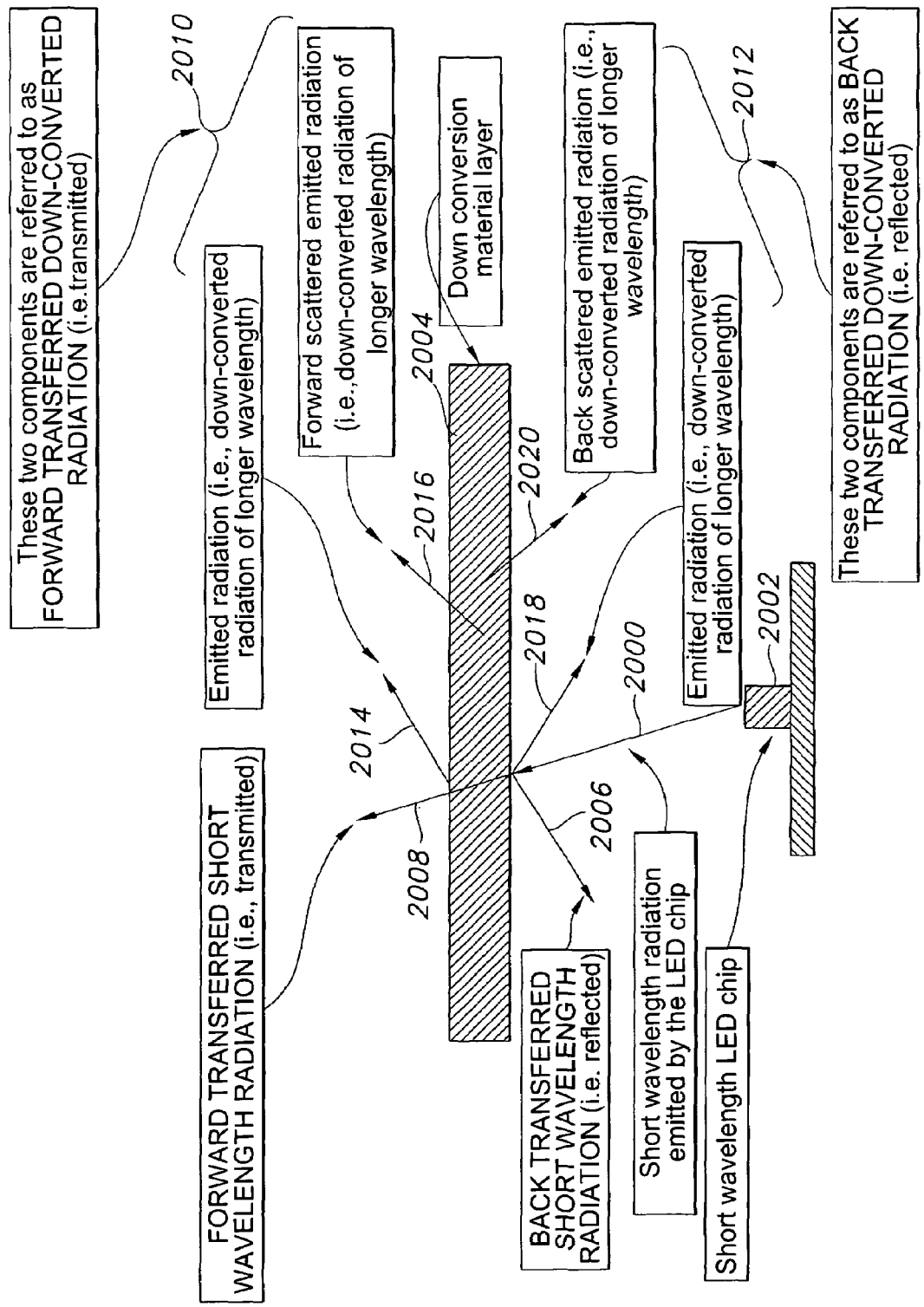
FIG. 1 is a diagram illustrating the exemplary radiation rays that may result when an exemplary radiation ray from a short-wavelength radiation source such as an LED chip impinges on a layer of down conversion material.

FIG. 1 is a diagram illustrating the exemplary radiation rays that may result when an exemplary radiation ray 2000 from a short-wavelength radiation source such as an LED chip 2002 impinges on a layer of down conversion material 2004. The impingement of exemplary short-wavelength radiation 2000 from a short-wavelength source such as an LED chip 2002 onto a down conversion material layer 2004 may produce radiation with four components: back transferred short-wavelength radiation 2006 reflected from the down conversion material layer 2004; forward transferred short-wavelength radiation 2008 transmitted through the down conversion material layer 2004; forward transferred down-converted radiation 2010 transmitted through the down conversion material 2004; and back transferred down-converted radiation 2012 reflected from the down conversion material 2004. The four components may combine to produce white light.

Two of the four components 2010 and 2012 may each be comprised of two sub-components. One of the sub-components of forward transferred down-converted radiation may be emitted radiation 2014; i.e., down-converted radiation having a longer wavelength than the short-wavelength radiation that impinges onto the down conversion material layer 2004. The emitted radiation sub-component 2014 of forward transferred down-converted radiation may be produced by short-wavelength radiation 2000 impinging on particles of the down conversion material 2004 as it is transmitted through the down conversion material 2004. The second sub-component of forward transferred down-converted radiation may be forward scattered emitted radiation 2016; i.e., other down-converted radiation having a longer wavelength than the short-wavelength radiation 2000 that impinges onto the down conversion material layer 2004. The forward scattered emitted radiation sub-component 2016 of forward transferred down-converted radiation 2010 may be produced by short-wavelength radiation 2000 impinging on particles of the down conversion material 2004 and that also bounces back and forth on the particles of the down conversion material 2004 before being transmitted through the down conversion material 2004.

One of the sub-components of back transferred down-converted radiation 2012 may be emitted radiation 2020; i.e., down-converted radiation having a longer wavelength than the short-wavelength radiation 2000 that impinges onto the down conversion material layer 2004. The emitted radiation sub-component 2018 of back transferred down-converted radiation 2012 may be produced by short-wavelength radiation 2000 impinging on particles of the down conversion material 2004 as it is reflected from the down conversion material 2004. The second sub-component of back transferred down-converted radiation 2012 may be back scattered emitted radiation 2020; i.e., other down-converted radiation having a longer wavelength than the short-wavelength radiation 2000 that impinges onto the down conversion material layer 2004. The back scattered emitted radiation sub-component 2020 of back transferred down-converted radiation 2012 may be produced by short-wavelength radiation 2000 impinging on particles of the down conversion material 2004 and that also bounces back and forth on the particles of down conversion material 2004 before being reflected from the down conversion material 2004.

White light may be produced by the combinations of the various components discussed above. In the forward transferred direction (i.e., for radiation 2008, 2014, 2016, 2010 that is transmitted through the down conversion material layer), white light may be produced by the combination of forward transferred short-wavelength radiation 2008 with either or both of the sub-components 2014, 2016 of the forward transferred down-converted radiation 2010. That is, white light may be produced in the forward transferred direction by the combination of forward transferred short-wavelength light 2008 with transmitted emitted radiation 2014 and/or with transmitted forward scattered emitted radiation 2016.

In the back transferred direction (i.e., for radiation 2006, 2018, 2020, 2012 that is reflected from the down conversion material layer), white light may be produced by the combination of back transferred short-wavelength radiation 2006 with either or both of the sub-components 2018, 2020 of the back transferred down-converted radiation 2012. That is, white light may be produced in the back transferred direction by the combination of back transferred short-wavelength light 2006 with reflected emitted radiation 2018 and/or with reflected back scattered emitted radiation 2020.

The wavelength of the forward transferred short-wavelength radiation 2008 may be about the same as the wavelength of the radiation 2000 emitted by a radiation source such as an LED chip 2002. The wavelength of the back transferred short wavelength radiation 2006 may be about the same as the wavelength of the radiation 2000 emitted by the radiation source 2002. The wavelength of the forward transferred short-wavelength radiation 2008 may be about the same as the wavelength of the back transferred short-wavelength radiation 2006. In an exemplary embodiment, the radiation source 2002 may emit radiation exhibiting a wavelength that is less than 550 nm, more particularly in a range of about 200 nm to less than 550 nm. Accordingly, the wavelength of the forward transferred short-wavelength radiation 2008 and the wavelength of the back transferred short-wavelength radiation 2006 may be less than 550 nm, more particularly in a range of about 200 nm to less than 550 nm.

The wavelength of the forward transferred down-converted radiation 2010 (including its sub-components 2014, 2016) and the wavelength of the back transferred down-converted radiation 2012 (including its sub-components 2018, 2020) may be any wavelength that is longer that the excitation spectrum of the down conversion material 2004. In an exemplary embodiment, the excitation spectrum of the down conversion material 2004 may be in the range of about 300 nm to about 550 nm. In alternative embodiments, other down conversion materials may be used that have an excitation spectrum other than in the range of about 300 nm to about 550 nm. The excitation spectrum of the down conversion material 2004 should produce radiation having a wavelength that is longer than the wavelength of the radiation produced by the short-wavelength emitting radiation source 2002. In an exemplary embodiment, the down conversion material 2004 may produce radiation in the range of from about 490 nm to about 750 nm.

The inventors have discovered that the performance of phosphor converted LEDs is negatively affected when placing the down-conversion phosphor close to the LED die. Poor performance is mainly due to the fact that the phosphor medium surrounding the die behaves like an isotropic emitter, and some portion of the back transferred radiation towards the die circulates between the phosphor layer, the die, and the reflector cup. As a result, the back transferred radiation increases the junction temperature, thus reducing system efficacy and increasing the yellowing of the encapsulant. All of these factors reduce the light output over time.

The literature shows that 60 percent of the light impinging on the phosphor layer is back transferred, contributing to the described effects (Yamada, et al., 2003). Lab measurements of eight YAG:Ce phosphor plates proved that nearly 60% of the radiant energy is transferred back in the direction of the blue LED source. The absolute magnitude of the radiant energy reflected depends, among other factors, on the density of the phosphor coating.

Such effects are expected to be of a higher magnitude in RCLEDs, because their light output is much more collimated. Consequently, the packaging attempts to capture the transmitted, emitted, and reflected components to improve system efficiency. Additionally, the inventors have created packaging that allows the phosphor layer to be moved away from the die, preventing radiation feedback into the LED and RCLED. As a result, the packaging increases the efficiency of the device by allowing more of the radiation reflected off and emitted by the phosphor layer to exit the device. At the same time, radiation from the RCLED impinges on the phosphor layer uniformly to obtain a uniform white light source. In addition, the life of the LED and RCLED is improved.

In traditional phosphor-converted white LEDs, where the phosphor is placed adjacent the die, more than 65% of the light generated by the phosphor is back-scattered and lost within the LED package. Based on these findings, a technique referred to as Scattered Photon Extraction™(SPE™) has been developed. An aspect of the technique has been disclosed in pending International Application No. PCT/US2005/015736 filed on May 5, 2005 and published at WO 2005/107420 A2 on Nov. 17, 2005.

To increase the light output from a phosphor-converted white LED (pc-LED) and to achieve higher luminous efficacy, the down-conversion material (e.g., phosphor or quantum dots) is removed to a remote location and a properly tailored optic device is placed between the LED chip and the down-conversion material layer. Then, the back transferred light can be extracted to increase the overall light output and efficacy. This technique significantly increases the overall light output and luminous efficacy of a pc-white LED by extracting the phosphor emitted and back scattered reflected radiation, and the reflected short-wavelength radiation that otherwise would be lost. The invention described in this specification may achieve a 1500-lumen package at 150 lm/W, for example, using an LED chip array. In an exemplary embodiment, the LED chip array may be nitride-based. In alternative embodiment, the LED chip array may be AlInN-based or any other short wavelength emitter.

Figure 2:
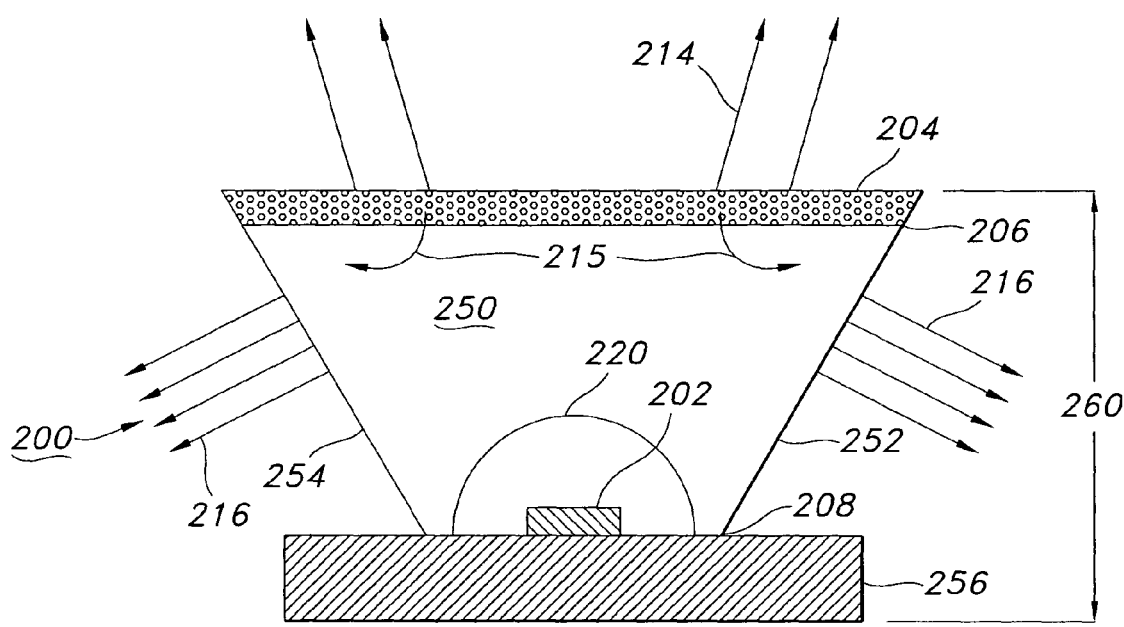
FIG. 2 is a partial cross-section view of an optic device making use of a down conversion material that is remote from a short wavelength radiation source.

FIG. 2 illustrates a device using the SPE™ technique. It illustrates a high efficiency light source that may use one or more solid state emitters and down conversion material. It illustrates an optic device making use of a down conversion material that is remote from a short wavelength radiation source. The down conversion material may be a phosphor or quantum dots. As shown, device 200 may include a radiation source 202 for emitting short wavelength radiation. Radiation source 202 is separated from phosphor layer 204 by optic device 250 which may be made of a substantially transparent medium that may be substantially light transmissive. The substantially transparent medium may be, for example, air, glass or acrylic. Optic device 250, as well as all of the embodiments disclosed in the application, may be cylindrical in shape or may have another curved or linear shape. For purposes of illustration, optic device 250 is shown as having walls 252 and 254, which may be substantially transparent and substantially light transmissive walls. Phosphor layer 204 may be placed adjacent to or on a portion 206 of optic device 250.

Phosphor or quantum dot layer 204 may include additional scattering particles (such as micro spheres) to improve mixing light of different wavelengths. Also, the phosphor or quantum dot layer 204 may be of a single phosphor (or quantum dot) or multiple phosphors (or quantum dots) to produce different colored down-converted radiation that may be in several different spectral regions. Alternatively, a layer with scattering particles only may be placed above, or below, or above and below the down conversion material layer 204 to improve color mixing.

The portion 206 of optic device 250 upon which phosphor layer 204 may be deposited may be an end of optic device 250. Radiation source 202 may be located at another portion of optic device 250. For example, radiation source 202 may be located at another end 208 of optic device 250. Optic device 250 may be placed upon a base 256.

Short wavelength radiation source 202 may be located between walls 252 and 254. Both the short wavelength radiation source 202 and the optic device 250 may be positioned on the base 256.

Exemplary radiation rays 214 may comprise radiation transmitted through phosphor layer 204 including forward transferred short-wavelength radiation transmitted through the phosphor layer 204 and forward down-converted radiation transmitted through the phosphor layer 204.

Exemplary radiation rays 215 may comprise back transferred short-wavelength radiation and back transferred down-converted reflected radiation that may be emitted and/or scattered back by phosphor layer 204. Exemplary radiation rays 216 may comprise radiation scattered back by phosphor layer 204. Exemplary radiation rays 216 may comprise the radiation rays 215 that may be transmitted through the substantially transparent, substantially light transmissive walls 252, 254. Although exemplary arrows 215 show back transferred radiation being transferred around the middle of side walls 252 and 254, it will be understood that back transferred radiation may be transferred through side walls 252 and 254 at multiple locations along the side walls 252 and 254. The transfer of radiation outside the optic device 250 may be referred to as extraction of light. Accordingly, both radiation rays 215 and radiation rays 216 may include short wavelength radiation reflected from the phosphor layer 204 and down-converted reflected radiation that may be emitted and/or scattered from the phosphor layer 204. Some or all of radiation rays 215 and/216 may be seen as visible light.

The transfer (extraction) of radiation through side walls 252 and 254 may occur because optic device 250 may be configured and designed with substantially transparent, substantially light transmissive walls 252 and 254 to extract radiation from inside optic device 250 to outside optic device 250. In addition, various widths of optic device 250 may be varied in order to extract a desired amount of radiation out of the optic device 250. The widths that may be varied are the width at the end 206 and the width at the end 208. Similarly, widths between ends 206 and 208 may be varied. The widths between ends 206 and 208 may result in walls 252 and 254 being substantially straight, curved, or having both straight and curved portions.

The dimensions of the features of optic device 250 discussed above may be varied depending upon the application to which the optic device 250 may be used. The dimensions of the features of optic device 250 may be varied, and set, by using the principles of ray tracing and the principles of total internal reflection (TIR). When principles of TIR are applied, reflectivity of radiation off of one or both of walls 252 and 254 may exceed 99.9%. The principles of TIR may be applied to all of the embodiments disclosed in this application.

The dimensions of optic device 250 may be set in accordance with the use to which the optic device may be put. For example, the dimensions of the optic device may be set in order to maximize the amount of radiation from radiation source 202 that enters into optic device 250. Alternatively, the dimensions of optic device 250 may be set in order to maximize the amount of radiation from radiation source 202 that impinges upon down conversion material 204. Also alternatively, the dimensions of optic device 250 may be set in order to maximize the amount of radiation that is back transferred from down conversion material 204. Also alternatively, the dimensions of optic device 250 may be set in order to maximize the amount of radiation that is extracted through walls 252 and 254. Also alternatively, the dimensions of optic device 250 may be set in order to provide a device that, to the extent possible, simultaneously maximizes each of the radiation features discussed above: the amount of radiation entering into optic device 250; the amount of radiation that impinges upon down conversion material 204; the amount of radiation that is back transferred from down conversion material 204; and the amount of radiation that is extracted through walls 252 and 254. In addition, the dimensions of optic device 250 may be set so that any or all of the features discussed above are not maximized. The principles of ray tracing and the principles of TIR may be used in order to implement any of these alternatives.

Some of the dimensions that may be varied are the diameter of end 206 of the optic device; the diameter of end 208 of optic device; the angle of walls 252 and/or 254 relative to end 208; the shape of walls 252 and/or 254. For example, walls 252 and/or 254 may be straight, curved, or combinations of straight and curved. A height 260 of the optic device 250 may be less than 30 mm.

The refractive index of optic device 250 may be in a range from about 1.4 to about 1.7. Radiation source 202 may have a refractive index in the range of about 1.7 to about 2.6. Radiation source 202 may be encapsulated by a material such a radiation transmissive epoxy 220. The encapsulating material may be referred to as a dome 220. The height of dome 220 may be about 2 mm to about 10 mm. Dome 220 may be used for beam control and to improve the efficiency of the radiation source, such as when the radiation source 202 is an LED. In order to provide these advantages, the refractive index of the dome 220 may be in range of about 1.4 to about 1.7. The refractive index of dome 220 may be selected to be between the refractive index of radiation source 202 and the refractive index of optic device 250 so that the dome 220 may provide a transition for radiation between the output of radiation source 202 and optic device 250.

An aperture is provided in end 208 of optic device 250. The aperture may be sized and shaped to receive the dome 220 along with the encapsulated radiation source 202. Accordingly, the height of the aperture may be about 2 mm to about 15 mm in order to fully receive dome 220.

Figure 3:
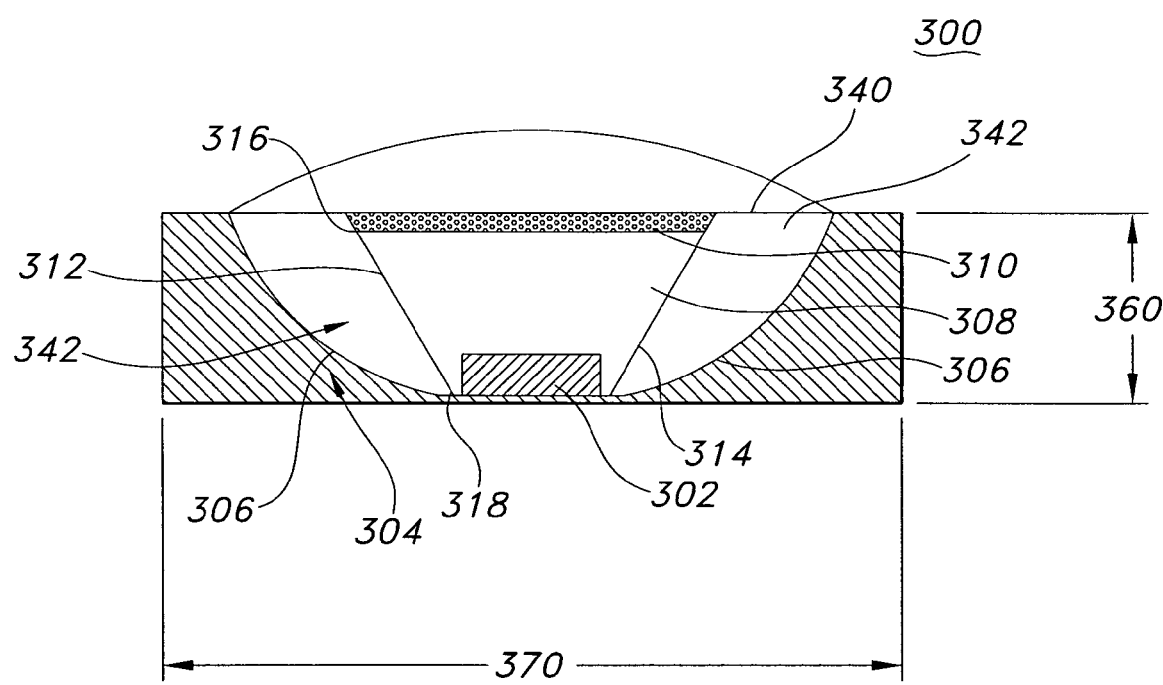
FIG. 3 is a partial cross-section view of a light emitting apparatus according to an exemplary embodiment of the present invention.

FIG. 3 is a partial cross-section view of a light emitting apparatus according to an exemplary embodiment of the present invention. FIG. 3 shows a short wavelength radiation source 302 that may be a light emitting diode (LED), a laser diode (LD), or a resonant cavity light emitting diode (RCLED). Radiation emitting source 302 is not encapsulated by a dome. Radiation emitting source 302 may either be manufactured without a conventional dome or it may be manufactured with a dome, which may be removed as needed. Radiation emitting source 302 may emit short wavelength radiation. One side of radiation source 302 may be positioned on a heat sink 304 which may transfer heat away from radiation source 302. An inside surface 306 of heat sink 304 may be a reflective surface to form a reflective cup. In an exemplary embodiment, the shape of reflective surface 306 may be a parabola for illustration purposes, but it may take any geometric shape such as a concave shape, an elliptical shape, or a flat shape. In an exemplary embodiment, the length 370 of heat sink 304 may be about 5 mm. Reflective surface 306 may direct some of the light extracted from optic device toward down conversion material 310 and may direct some of the extracted light toward a lens 340 without impinging upon down conversion material 310.

An optic device 308 may be positioned on the heat sink 304 and over the radiation source 302. Optic device 308 may make use of a down conversion material 310 that is placed on a portion 316 of optic device that is remote from radiation source 302. The down conversion material 310 may be a phosphor or quantum dots. Radiation source 302 is separated from phosphor layer 310 by optic device 308 which may be made of a substantially transparent medium that may be substantially light transmissive. The substantially transparent medium may be, for example, air, glass or acrylic. Optic device 308 may have substantially transparent and substantially light transmissive walls 312 and 314.

Phosphor or quantum dot layer 310 may include additional scattering particles (such as micro spheres) to improve mixing light of different wavelengths. Also, the phosphor or quantum dot layer 310 may be of a single phosphor (or quantum dot) or multiple phosphors (or quantum dots) to produce different colored down-converted radiation that may be in several different spectral regions. Alternatively, a layer with scattering particles only may be placed above, or below, or above and below the down conversion material layer 310 to improve color mixing.

The portion 316 of optic device 308 upon which phosphor layer 310 may be deposited may be an end of optic device 308. Radiation source 302 may be located at another portion of optic device 308. For example, radiation source 302 may be located at another end 318 of optic device 308. As indicated, optic device 308 may be placed upon a base which may be heat sink 304.

Short wavelength radiation source 302 may be located between walls 312 and 314 of optic device 308. Both the short wavelength radiation source 302 and the optic device 308 may be positioned on the heat sink 304.

The operation of, and the interrelationship between, radiation source 302, optic device 308, and down conversion material 310 may be the same as the operation and interrelationship between corresponding elements described and illustrated in FIGS. 1 and 2. Short wavelength radiation emitted by radiation source 302 may result in radiation transmitted through phosphor layer 310 including forward transferred short-wavelength radiation transmitted through the phosphor layer 310 and forward down-converted radiation transmitted through the phosphor layer 310; and back transferred short-wavelength radiation and back transferred down-converted reflected radiation that may be emitted and/or scattered back by phosphor layer 310. It will be understood that back transferred radiation may be transferred through side walls 312 and 314 at multiple locations along the side walls 312 and 314. The transfer of radiation outside the optic device 308 may be referred to as extraction of light. Accordingly, radiation rays that may be extracted from optic device 308 may include short wavelength radiation reflected from the phosphor layer 310 and down-converted reflected radiation that may be emitted and/or scattered from the phosphor layer 310. Some short wavelength radiation emitted from the top and the sides of the radiation source 302 may leave optic device 308 without impinging upon down conversion material 310. Some or all of the extracted short wavelength reflected radiation and the extracted down converted reflected radiation may be seen as visible light.

The transfer (extraction) of radiation through side walls 312 and 314 may occur because optic device 308 may be configured and designed with substantially transparent, substantially light transmissive walls 312 and 314 to extract radiation from inside optic device 308 to outside optic device 308. In addition, various widths of optic device 308 may be varied in order to extract a desired amount of radiation out of the optic device 308. The widths that may be varied are the width at the end 316 and the width at the end 318. Similarly, widths between ends 316 and 318 may be varied. Variations in the widths of walls 312 and 314 between ends 316 and 318 may be created by varying shapes of walls 312 and 314. Walls 312 and 314 may be substantially straight, curved, or have both straight and curved portions.

The dimensions of the features of optic device 308 discussed above may be varied depending upon the application to which the optic device 308 may be used. The dimensions of the features of optic device 308 may be varied, and set, by using the principles of ray tracing and the principles of total internal reflection (TIR). When principles of TIR are applied, reflectivity of radiation off of one or both of walls 312 and 314 may exceed 99.9%. The principles of TIR may be applied to all of the embodiments disclosed in this application.

The dimensions of optic device 308 along with characteristics of down conversion material 310 may be set or adjusted in accordance with the use to which the optic device may be put. For example, the dimensions of the optic device may be set in order to maximize the amount of radiation from radiation source 302 that enters into optic device 308. Alternatively, the dimensions of optic device 308 may be set in order to maximize the amount of radiation from radiation source 302 that impinges upon down conversion material 310. Also alternatively, the dimensions of optic device 302 may be set in order to maximize the amount of radiation that is back transferred from down conversion material 310. Also alternatively, the dimensions of optic device 308 may be set in order to maximize the amount of radiation that is extracted through walls 312 and 314.

It will also be understood that dimensions of other embodiments of optic device 308 and characteristics of down conversion material 310 may be set or adjusted to produce radiation features that are not maximized. In these other embodiments, one or more of the amounts of radiation entering into optic device 308; impinging upon down conversion material 310; back transferred from down conversion material 310; and extracted through walls 312 and 314 may be adjusted to a one or more of a variety of levels that may be less than their respective maximum levels, depending upon the use to which the optic device is put. The dimensions of optic device 308 may also be varied depending upon relative cost needs versus the needed efficiency of light extraction for a particular use of the optic device.

The principles of ray tracing and the principles of TIR may be used in order to implement any of these alternatives.

Some of the dimensions that may be varied are the diameter of end 316 of the optic device; the diameter of end 318 of optic device; the angle of walls 312 and/or 314 relative to end 318; the shape of walls 312 and/or 314. For example, walls 312 and/or 314 may be straight, curved, or combinations of straight and curved. In an exemplary embodiment, a height 360 of the optic device 308 may be about 3 mm.

Figure 4:
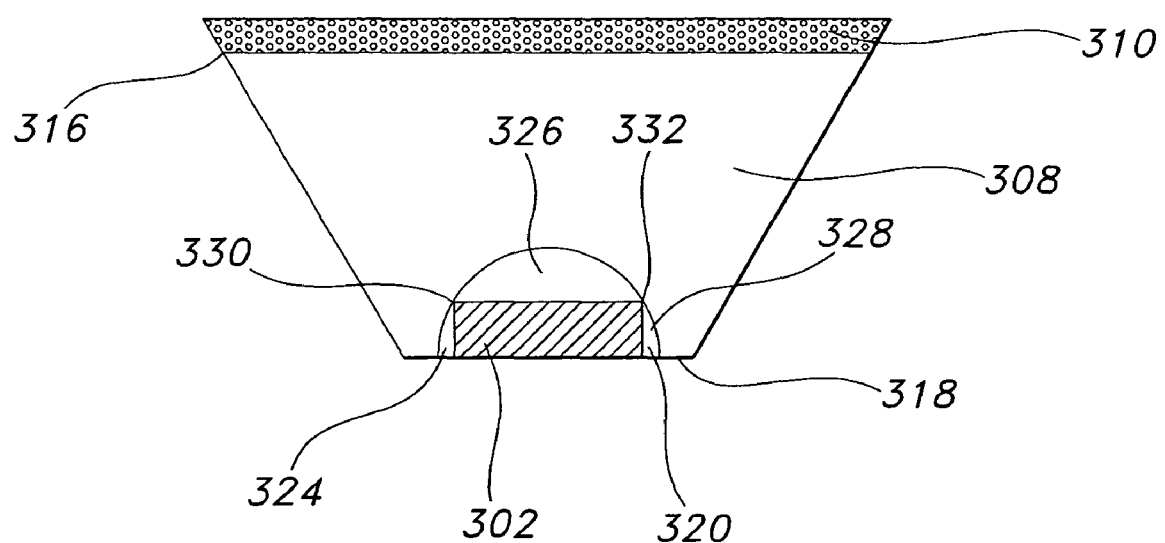
FIG. 4 is a partial cross-section view of the optic device illustrated in FIG. 3 having an exemplary embodiment of an aperture.

FIG. 4 is a partial cross-section view of the optic device illustrated in FIG. 3 having an exemplary embodiment of an aperture. More specifically, FIG. 4 is a partial cross-section view of optic device 308 having an exemplary embodiment of an aperture 320. FIG. 4 shows optic device 308 and down conversion material 310 on an end 316 of optic device 308. FIG. 4 shows the aperture 320 in end 318 of optic device 308. The aperture 320 may be sized and shaped to receive the radiation source 302 so that optic device 308 at least partially surrounds radiation source 302 because a substantial amount of radiation source 302 is within the aperture 320. As shown in the exemplary embodiment illustrated in FIGS. 3 and 4, when radiation source 302 is within aperture 320, substantially all of the radiation source 302 may be surrounded by optic device 308. The only portion of radiation source 302 that may not be surrounded by optic device 308 is the portion that rests on heat sink 304. When the radiation source 302 is positioned within the aperture 320 of optic device 308 as shown in FIGS. 3 and 4, it may be said that radiation source 302 is fully immersed within the optic device 308. In an exemplary embodiment, the dimensions of radiation source 302 may be about 1 mm by about 1 mm by about 0.3 mm and the diameter of aperture 320 may be about 2 mm. By using a radiation source without a dome, the height 360 of the optic device 308 may be smaller than, for example, the height 260 of the optic device 250 shown in FIG. 2.

Figure 5:
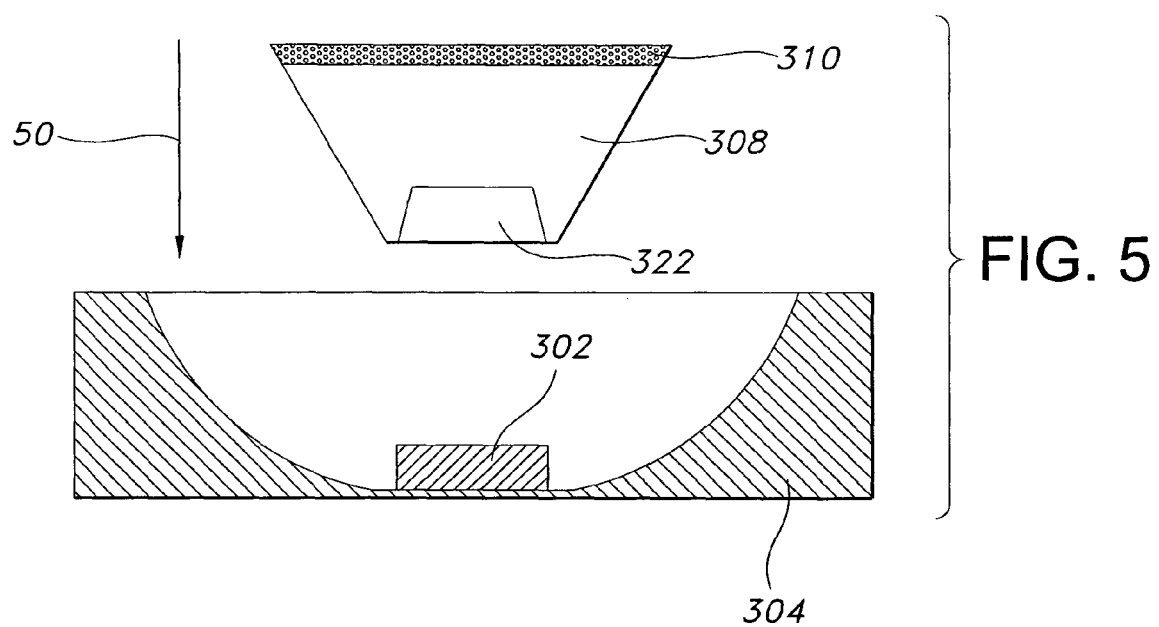
FIG. 5 is a partial cross-section view of the optic device illustrated in FIG. 3 having an alternative embodiment of an aperture.

It will be understood that the aperture in the optic device may have a variety of shapes. As shown in FIG. 4, for example, aperture 320 may have a curved shape. FIG. 5 is a partial cross-section view of the optic device illustrated in FIG. 3 having an alternative embodiment of an aperture. In the alternative embodiment shown in FIG. 5, an aperture 322 may be in a shape that more nearly approximates the shape of the radiation source 302. For example, as shown in FIG. 5, the shape of aperture 322 of optic device 308 may be a trapezoid. In an exemplary embodiment, the dimensions of aperture 322 may be equal to or somewhat larger than the diameter of the radiation source 302. As indicated by arrow 50 in FIG. 5, optic device 308 with trapezoid shaped aperture 322 may be placed on top of, and substantially surround, radiation source 302. When an aperture such as aperture 322 is used, and when optic device 308 is placed on top of radiation source 302, FIG. 3 may illustrate the radiation source 308 within aperture 322 of optic device 308. As shown in FIGS. 3 and 5, the aperture in optic device 308 may be shaped to closely match the shape of the radiation source 302. Regardless of which aperture shaped is used, the radiation source 302 may be fully immersed within the optic device 308 and may be substantially surrounded by optic device 308, except for the side of radiation source 302 that may rest on heat sink 304 or other supporting base if a heat sink is not used, in an alternative embodiment.

The refractive index of optic device 308 may be in a range from about 1.4 to about 1.7. Radiation source 302 may have a refractive index in the range of about 1.7 to about 2.6. Referring to FIG. 4, there may be air spaces such as spaces 324, 326, and 328 between radiation source 302 the inside of optic device 308. Referring to FIG. 4, there may also be an air space (not shown) between corner 330 of radiation source 302 and the adjacent point of the optic device 308 inside aperture 320 and between corner 332 of radiation source 302 and the adjacent point of the optic device 308 inside aperture 320. Referring to FIGS. 3 and 5, there may also be air spaces between the sides of radiation source 302 and the inside of optic device 308 within aperture 322. There may also be air spaces between radiation source 302 and the inside of optic device 308 within the aperture regardless of the respective shapes of the radiation source and the aperture. In order to provide a transition for radiation passing from radiation source 302 to optic device 308, a sealant may be placed to fill the spaces between radiation source 302 and optic device 308. Accordingly, a sealant may be placed in the spaces for any shape of the radiation source and any shape of the aperture within the optic device. The sealant may provide a transition for radiation passing from the respective radiation source to the optic device.

In an exemplary embodiment, the sealant may fill in each of the spaces as much as possible in order to obtain the best efficiency of radiation transfer from the radiation source 302 to the optic device 308. The efficiency of transferring radiation from radiation source 302 to optic device 308 may decrease if each of the spaces are not completely filled. The sealant may also be used as a binding material to bind the optic device 308 to the radiation source 302. A better bond between the optic device 308 and the radiation source 302 may result in better efficiency of radiation transfer from radiation source 302 to optic device 308.

In an exemplary embodiment, the sealant material may be a silicon gel, epoxy, polymer or any other sealant that is substantially light transmissive, that has the necessary refractive index, and that is pliable enough to substantially seal the spaces. The sealant material may have a refractive index that is between the refractive index of radiation source 302 and optic device 308. In an exemplary embodiment, the refractive index of the sealant may be in a range that is between the refractive index of the radiation source 302 and the refractive index of optic device 308. For example, the refractive index of the sealant may be in the range of about 1.5 to about 2.3. In an exemplary embodiment enough sealant should be used that may effect substantially filling of all spaces including, but not limited to, spaces 320, 324 and 326. Using a radiation source without a dome and using a sealant such as a gel as an interface between the radiation source and the optic device may allow the design of an optic device that is substantially shorter than an optic device that uses a radiation source that is encapsulated with a dome. For example, referring to FIG. 2, the height 260 of apparatus 200 may be about 20 mm. In contrast, referring to FIG. 3, the height 360 of apparatus 300 may be about 3 mm. Using a sealant instead of a dome therefore gives a user much more flexibility in the design and manufacture of a light emitting apparatus that incorporates the features of SPE™ technique. For example, by using more or less sealant, a light emitting apparatus may be manufactured that has a height in a range of about 2 mm to about 10 mm.

Referring back to FIG. 3, a lens 340 may be placed on top of, and over, the optic device 308 and the down conversion material 310. Lens 340 may be used to focus light that may be forward transferred from the down conversion material 310 and light that may be reflected by the reflector 306. Lens 340 may also have a refractive index that may compensate for the refractive index of the air contained in space 342 that is formed when the lens 340 is placed on the optic device 308 and down conversion material 310. Lens 340 may be a spherical lens or may be any other shape that may direct the light as needed. Lens 340 may be attached to down conversion material using adhesive material. In an alternative embodiment, lens 340 may also be attached to the heat sink 304. In yet another alternative embodiment, lens 340 may be attached to both the down conversion material 310 and the reflective cup 306.

Figures 6, 7:
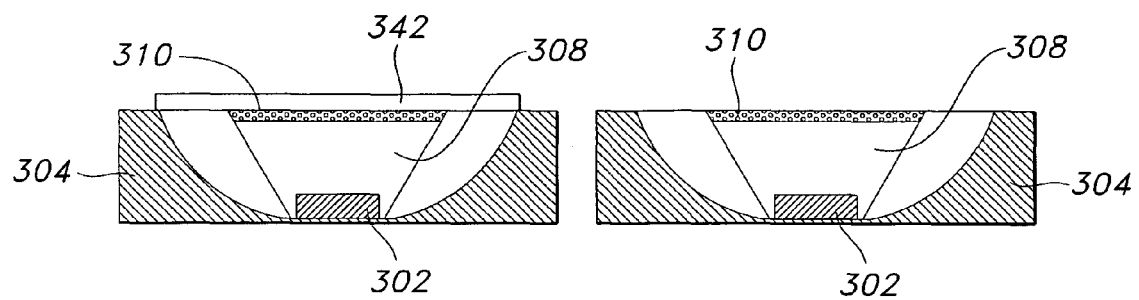
FIG. 6 is a partial cross-section of an embodiment of the invention having an exemplary embodiment of a lens adjacent the down conversion material.
FIG. 7 is a partial cross-section of an alternative embodiment of the invention that does not have a lens adjacent the down conversion material.
Figures 8, 9:
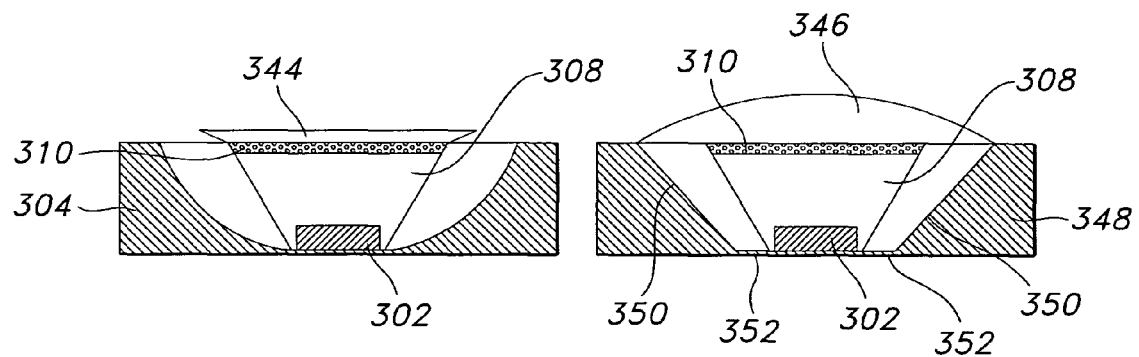
FIG. 8 is a partial cross-section of another alternative embodiment of the invention having an alternative embodiment of a lens adjacent the down conversion material.
FIG. 9 is a partial cross-section view of yet another alternative embodiment of the invention having yet another alternative embodiment of a lens adjacent the down conversion material.

FIGS. 6 to 9 illustrate alternative embodiments of the apparatus shown in FIGS. 3-5. In each of these embodiments, the optic device 308, down conversion material 310, radiation source 302 and aperture (not shown in FIGS. 6-9) may be the same as discussed with respect to any of FIGS. 3-5. FIG. 6 illustrates the apparatus as having a thin film with a microlens array 342 on top of the optic device 308 and the down conversation material 310. In this embodiment, the lens array 342 may be attached to the down conversion material 310 alone, to the heat sink 304 alone, or to both the down conversion material 310 and the heat sink 304. FIG. 7 illustrates the apparatus without any lens on top of the optic device 308 and the down conversion material 310. FIG. 8 illustrates a lens 344 that may be attached only to the down conversion layer 310. The lens 344 in this embodiment may be the any of the lenses illustrated and described in connection with FIGS. 3-5 and 7. FIG. 9 illustrates a lens 346 that may be any of the lenses illustrated and described in this application and a heat sink 348 with reflective surfaces 350 and 352. The reflective surfaces 350 and 352 of heat sink 348 may not have a parabolic shape or an elliptical shape. Instead, one or both of reflective surfaces 350 and 352 may have a linear shape.

FIG. 10 illustrates another embodiment of the invention. This embodiment has a plurality of short wavelength radiation sources. FIG. 10 illustrates an optic device 308 with a down conversion material 310 and an aperture 322 as illustrated in FIG. 5. These elements may have the same sizes as the corresponding elements illustrated in FIG. 5. However, instead of a single short wavelength radiation source 302 as shown in FIG. 5, the embodiment illustrated in FIG. 10 may have three short wavelength radiation sources 400, 402, 404 resting on heat sink 304. None of the short wavelength radiation sources 400, 402, 404 may be encapsulated by a dome. Because the size of aperture 322 in FIG. 10 may be the same size as aperture 322 in FIG. 5, the sizes of one or more of radiation sources 400, 402, 404 may be smaller than the size of radiation source 302 shown in FIG. 5. In an exemplary embodiment, the sizes of one or more of radiation sources 400, 402, and 404 may be about 0.3 mm by about 0.3 mm by about 0.3 mm. Although FIG. 10 shows three radiation sources being placed on heat sink 304, it will be understood that two short wavelength radiation sources may be used; or more than three short wavelength radiation sources may be used as long as they fit within aperture 322. A sealant may be used between at least one of the radiation sources and the surface inside aperture 322. The sealant for this embodiment of the invention and for all embodiments of the invention disclosed in this application may be the same sealant discussed with respect to FIGS. 3-5.

FIG. 11 illustrates another embodiment of the invention having a plurality of short wavelength radiation sources. In FIG. 11, three short wavelength radiation sources 302A, 302B, and 302C, each of which may be the same size as short wavelength radiation source 302 that is illustrated in FIG. 5. None of the radiation sources 302A, 302B, and 302C may be encapsulated by a dome. In order to accommodate these three radiation sources, the optic device 408 having a down conversion material 410 on portion 416 which may be an end of optic device 408 may be a larger version of optic device 308 illustrated in FIGS. 3, 5, and 10. In an exemplary embodiment, the size of aperture 422 illustrated in FIG. 11 may be about 6 mm. In addition, the size of heat sink 412 may be a larger version of heat sink 304 that is illustrated in FIGS. 3, 5, and 10. In an exemplary embodiment, the length 470 of heat sink 412 may be about 10 mm. Although FIG. 11 shows three short wavelength radiation sources 302A, 302B, 302C placed on heat sink 412, it will be understood that two short wavelength radiation sources may be used; or more than three short wavelength radiation sources may be used. If the number of radiation sources is different than the embodiment illustrated in FIG. 11, the size of aperture 422 and the size of heat sink 412 may be changed to accommodate them. As with the other embodiments in this application, a sealant may be used to seal all spaces (not shown) between each of the optic devices 302A, 302B, 302C and the surface of optic device 408 that is inside aperture 422.

FIG. 12 illustrates yet another embodiment of the invention having a plurality of short wavelength radiation sources. In FIG. 12, a single heat sink 500 is shown having three separate heat sink sections 502, 504, 506. Each of the heat sink sections may have its own respective reflective surfaces forming reflective cups 508, 510, 512 and its own respective short wavelength radiation source identified as short wavelength radiation sources 514, 516, and 520. In this embodiment, respective optic devices 522, 524, and 526 having respective down conversion materials 528, 530, 532 and respective apertures 534, 536, and 538 may be used. As with all of the other embodiments disclosed in this application, none of the radiation sources 514, 516, or 520 may have a dome. Instead, a sealant may be used in the spaces (not shown) between each of the respective radiation sources and the respective inside surfaces of respective apertures 534, 536, 538 of optic devices 522, 524, 526. Although FIG. 12 shows three radiation sources and other matching elements, it will be understood that two radiation sources may be used; or more than three radiation sources may be used. If the number of radiation sources is different than is shown in the embodiment illustrated in FIG. 12, the number of optic devices may also be different in order to match the number of radiation sources.

It will also be understood that for all embodiments illustrated in this application, various configurations of lenses and various attachments of such lenses may the same as illustrated and explained with respect to the embodiments illustrated in FIGS. 6 to 9.

Figure 14:
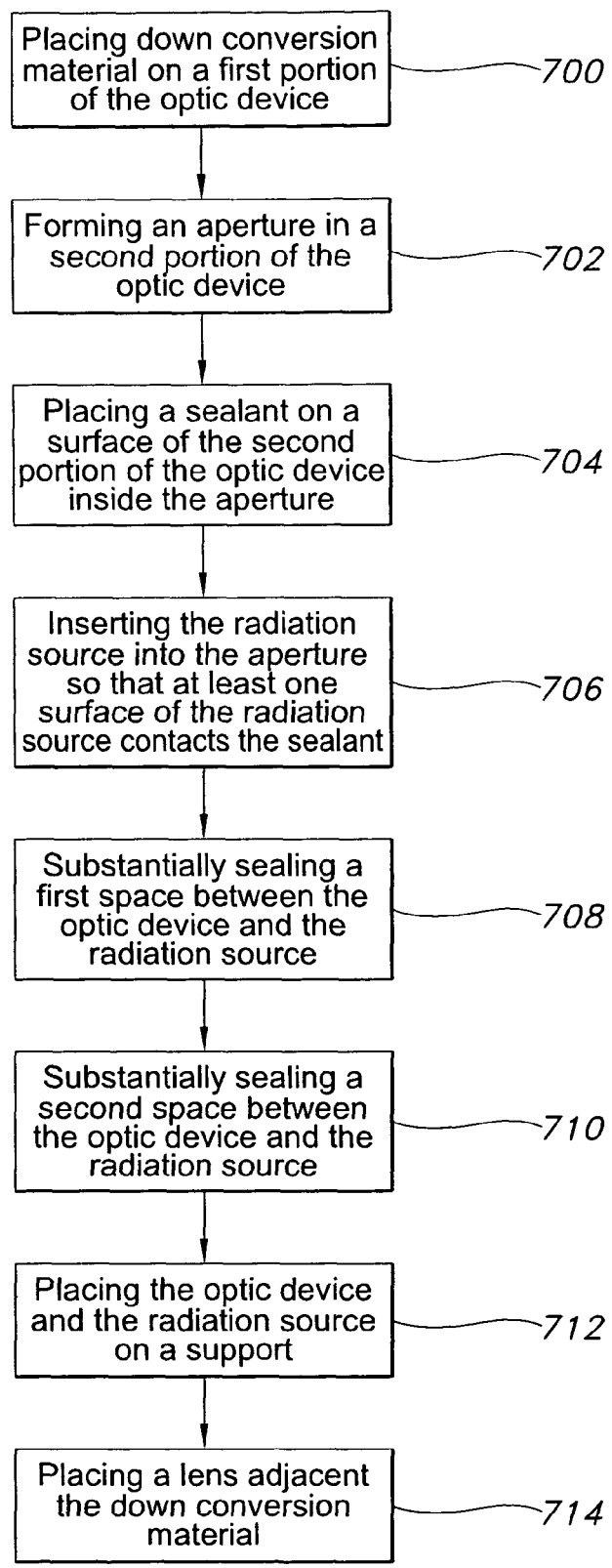
FIG. 14 illustrates an exemplary embodiment of a method that may be used to manufacture any of the embodiments of the invention described in connection with FIGS. 3-12.

FIG. 14 illustrates an exemplary embodiment of a method that may be used to manufacture any of the embodiments of the invention described in connection with FIGS. 3-12. The method may be used to manufacture a light emitting apparatus that has a radiation source for emitting short wavelength radiation, a down conversion material that receives at least some short wavelength radiation emitted by the radiation source, and an optic device configured to extract radiation back transferred from the down conversion material and/or radiation emitted from the short wavelength radiation source. As shown in Block 700, the down conversion material is placed on a first portion of the optic device. As explained previously, the first portion of the optic device may be a first end of the optic device. As shown in Block 702, an aperture is formed in a second portion of the optic device. The second portion of the optic device may be a second end of the optic device. It will be understood that the step of forming the aperture as shown in Block 702 may be performed before the step of placing the down conversion material as shown in Block 700. Block 704 shows that a sealant is placed on a surface of the second portion of the optic device, where the surface is inside the aperture. After the sealant is placed on the inside surface of the aperture, Block 706 shows that the radiation source may be placed into the aperture. When the radiation source is placed into the aperture, at least one surface of the radiation source may contact the sealant.

After the radiation source is placed into the aperture, at least first and second spaces between the optic device and the radiation source may be sealed, as shown in Blocks 708 and 710. After the spaces between the radiation source and the inside of the aperture have been sealed, the optic device, with the radiation source inside the aperture, may be placed on a support, as indicated in Block 712. The support may be a heat sink. It will be understood that the steps illustrated in Blocks 708 and 710 may be performed after the step illustrated in Block 712. After spaces between the radiation source and the inside of the aperture have been sealed and the device placed upon the support, a lens may be placed adjacent the down conversion material, as indicated in Block 714.

Figure 15:
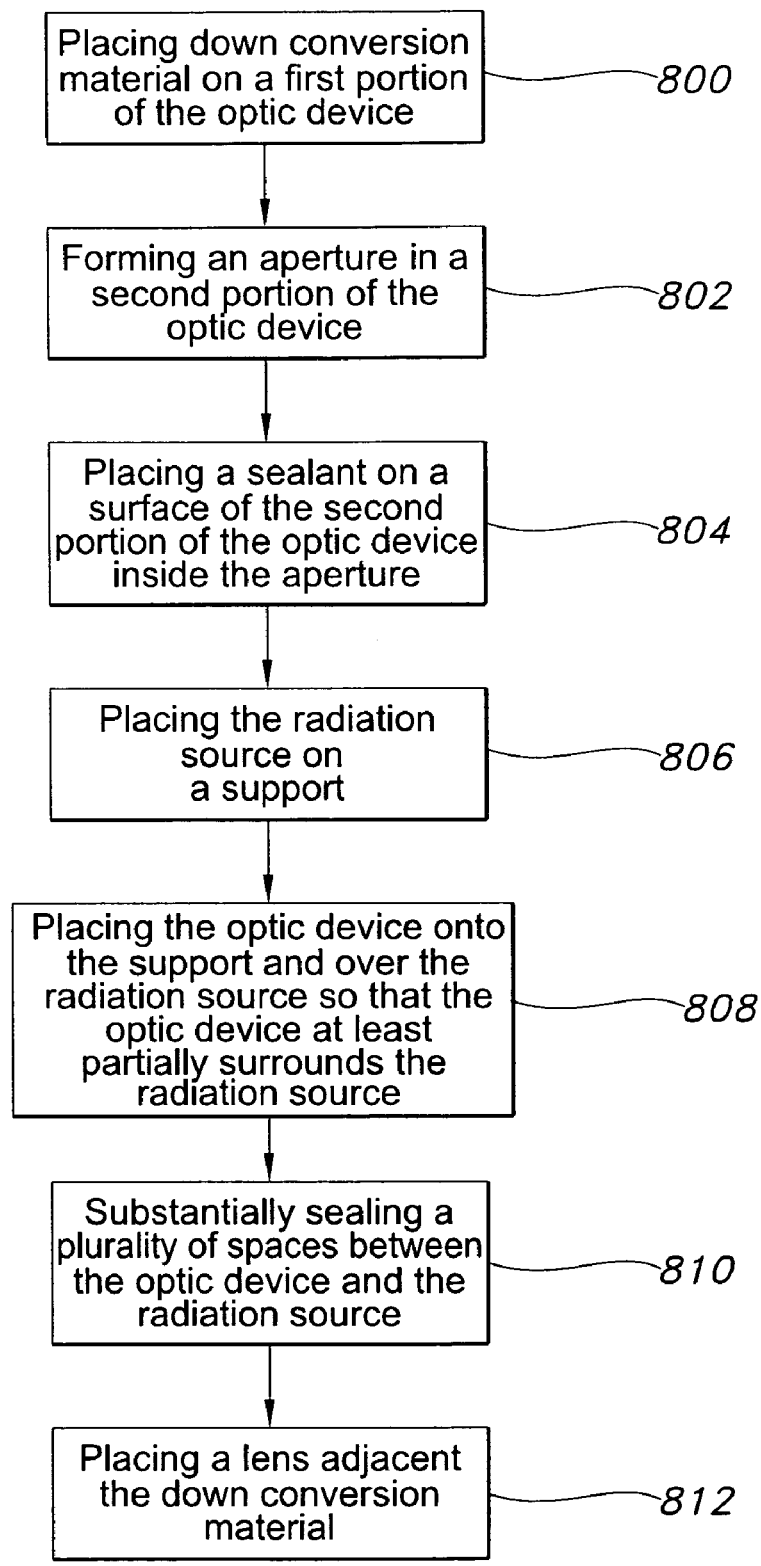
FIG. 15 illustrates another embodiment of a method of manufacturing any of the embodiments of the invention described in connection with FIGS. 3-12.

FIG. 15 illustrates another method of manufacturing any of the embodiments of the invention described in connection with FIGS. 3-12. In this method, the steps shown in Blocks 800, 802, and 804 are the same as the steps shown in Blocks 700, 702, and 704. After a sealant is placed on the inside surface of the aperture, the radiation source may be placed on the support, which may be a heat sink, as shown in Block 806.

It will be understood that the step of placing the radiation source on a support as shown in Block 806 may be performed before the steps illustrated in Blocks 800, 802, and 804. After the radiation source is placed on the support, the optic device, with the sealant on its surface inside the aperture, is placed onto the support and over the radiation source, as shown in Block 808. When this step is completed, the optic device may be substantially surrounding the radiation source, also as shown in Block 808. At this point, a plurality of spaces between the optic device and the radiation source may be sealed, as shown in Block 810. Then, a lens may be placed adjacent the down conversion material, as shown in Block 812. It will be understood that the step illustrated in Block 812 and the step illustrated in Block 714 may not be performed, for example, in manufacturing the embodiment shown in FIG. 7, where no such lens may be used.

Figure 13:
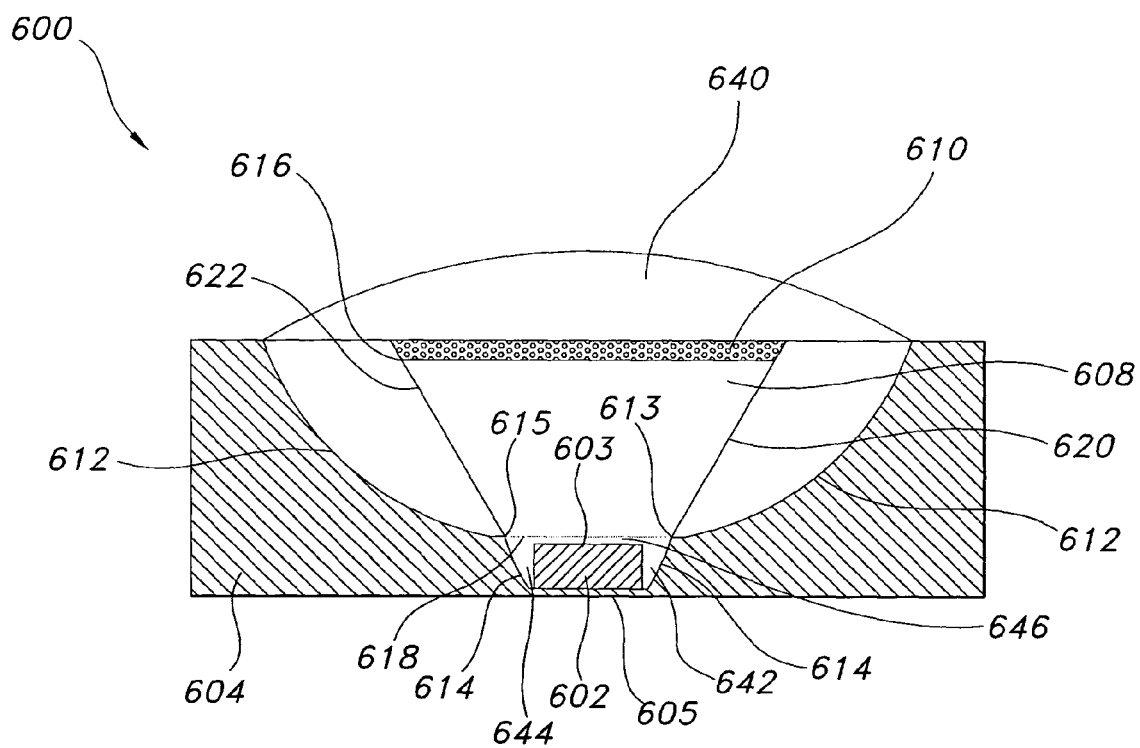
FIG. 13 is still another embodiment of the invention having a plurality of reflective surfaces adjacent the radiation source and the optic device.

FIG. 13 illustrates still another embodiment of the invention, wherein a plurality of reflective surfaces are adjacent the radiation source and the optic device. A light emitting apparatus 600 is shown in FIG. 13. Light emitting apparatus 600 has an optic device 608 with a down conversion material 610 on a portion 616 of the optic device 608 that may be an end of optic device 608. Apparatus 600 may also have a short wavelength radiation source 602 positioned on a heat sink 604. As is the case with all of the other embodiments in this application, short wavelength radiation source 602 may not be encapsulated by a dome. Heat sink 604 may form two reflective cups having reflective surfaces 612 and 614. The first reflective cup and surface 612 may be adjacent the second reflective cup and surface 614. The radius of reflective surface 612 may be the same or different than the radius of reflective surface 614. In addition, reflective surface 612 may be comprised of a plurality of surfaces each of which may have a different radius. The number of radii comprising reflective surface 612 may depend upon the height of optic device 608.

First reflective surface 612 may partially surround optic device 608 and down conversion material 610. As discussed regarding other embodiments of this invention, reflective surface 612 may direct light extracted from optic device 608 in the direction of down conversion material 610 and in the direction of lens 640.

Radiation source 602 may be positioned at the bottom of heat sink 604 so that the radiation source 602 may be partially surrounded by the reflective surface 614. First reflective surface 612 may be coupled to second reflective surface 614 at points illustrated by points 613, 615. A distance from the bottom 605 of heat sink 604 to points 613 and 615 may be equal to or greater than the height of radiation source 602. A diameter of end portion 618 of optic device 608 may be substantially equal to the distance between points 613 and 615.

In effect, radiation source 602 may be positioned in a well formed by the bottom 605 of heat sink 604 and the reflective cup formed by reflective surface 614. Reflective surface may direct radiation emitted from the sides of radiation source 602 into optic device 608. Some of the radiation reflected by reflective surface 614 may be transmitted into optic device 608 and may impinge on down conversion material 610. Some of the radiation reflected by reflective surface 614 may be transmitted into optic device 608 and may leave optic device 608 through walls 620, 622 without impinging upon down conversion material 610. Some of the radiation reflected by reflective surface 614 may be directed toward lens 640 without impinging on down conversion material 610.

In this embodiment of the invention, optic device 608 does not have an aperture in its end 618. End 618 of optic device 608 may be placed on a top surface 603 of radiation source 602. A sealant (not shown) may be placed in spaces 642, 644 between radiation source 602 and reflective surface 614 and in space 646 between radiation source 602 and end 618 of optic 608. The sealant may have the same characteristics and may be used for the same purposes as described in connection with other embodiments of this invention.

Figure 16:
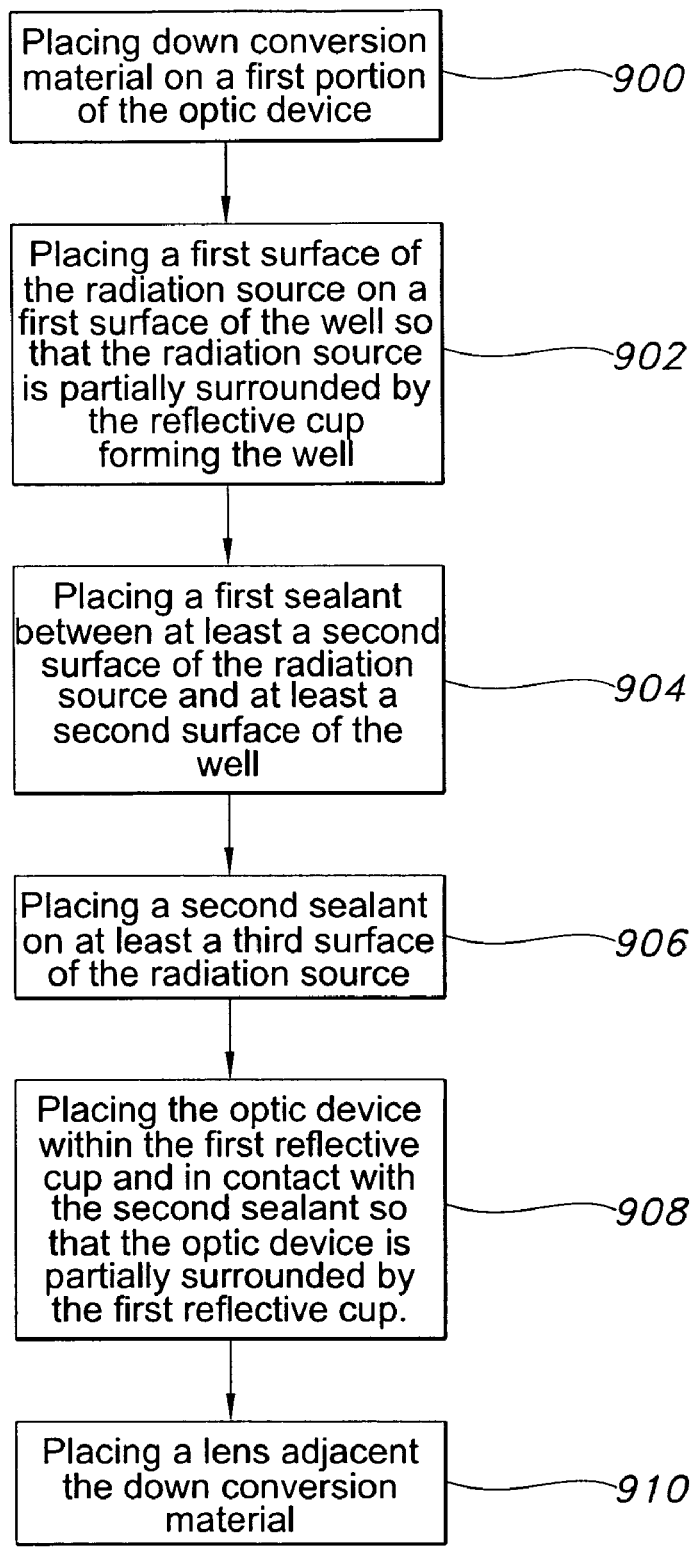
FIG. 16 illustrates an exemplary embodiment of a method that may be used to manufacture the embodiment of the invention described in connection with FIG. 13.

A method of manufacture will now be described for manufacturing the apparatus illustrated in FIG. 13. FIG. 16 illustrates an exemplary embodiment of the method that may be used to manufacture the embodiment of the invention described in connection with FIG. 13.

For this method of manufacturing a light emitting apparatus, there is a radiation source for emitting short wavelength radiation, a down conversion material that receives at least some short wavelength radiation emitted by the radiation source, an optic device configured to extract radiation back transferred from the down conversion material and/or radiation emitted from the short wavelength radiation source. There is also a first reflective cup and a second reflective cup. The second reflective cup is adjacent the first reflective cup and forms a well.

As shown in Block 900, the down conversion material is placed on a first portion of the optic device. As shown in Block 902, a first surface of the radiation source may be placed on a first surface of the well. After this step is performed, the radiation source may be partially surrounded by the reflective cup forming the well. A first sealant may then be placed between at least a second surface of the radiation source and a second surface of the well, as shown in Block 904. A second sealant may then be placed on a least a third surface of the radiation source, as shown in Block 906. The same kind of material, or different kinds of materials, may be used for the first and second sealants. As shown in Block 908, the optic device may then be placed within the first reflective cup so that the optic device is partially surrounded by the first reflective cup and in contact with the second sealant. A lens may then be placed adjacent the down conversion material, as shown in Block 910.

Another embodiment of the invention is illustrated in FIGS. 17 and 18. FIG. 17 is a partial cross-section view of an alternative embodiment of an optic device that may be mounted over a radiation source and onto a reflector. FIG. 17 shows optic device 1008 and down conversion material 1010 on an end 1016 of optic device 1008. FIG. 17 shows aperture 1020 in end 1018 of optic device 1008. Although aperture 1020 is illustrated as having a curved shape, aperture 1020 may have another shape that may more closely approximate a shape of a radiation source. For example, aperture 1020 may have a trapezoidal shape. FIG. 17 also illustrates a radiation source 1032 mounted on a heat sink 1034 having a reflective surface 1036 forming a reflective cup. The dimensions and characteristics of the optic device 1008, the aperture 1020, the down conversion material 1010, the radiation source 1032, the heat sink 1034 and the reflective surface 1036 may be the same as the dimensions and characteristics described in this application with respect to other embodiments of the invention. Radiation source 1032 has a height 1033. The optic device may also be mounted over the radiation source 1032 and onto the heat sink in the same way as has been described with respect to other embodiments of the invention. FIG. 18 illustrates optic device 1008 after it has been mounted over radiation source 1032 and onto heat sink 1034.

Referring to FIGS. 17 and 18, optic device 1008 may have side walls 1040 and 1042 between end 1016 and end 1018. A first portion of the side walls 1040, 1042 may be substantially light transmissive and a second portion of the side walls 1040, 1042 may not be substantially light transmissive. A reflective material 1046A may be applied to a portion of wall 1040 and a reflective material 1046B may be applied to a portion of wall 1042. Reflective materials 1046A and 1046B may be a highly reflective paint. In an exemplary embodiment, the paint may be made of barium-sulfate-based paint and may exhibit about 97% reflectivity. In an alternative embodiment, a vaporized aluminum coating, or a wavelength selective coating may be used instead of paint.

As illustrated in FIG. 18, short wavelength radiation may be emitted not only from the top 1050 of radiation source 1032, short wavelength radiation may also be emitted from the sides 1052 and 1054 of radiation source 1032. Arrows 1056 and 1058 indicate exemplary short wavelength radiation rays being emitted from sides 1052 and 1054, respectively, of short wavelength radiation source 1032. It will be understood that short wavelength radiation rays in addition to exemplary radiation rays 1056 and 1058 may also be emitted from sides 1052 and 1054. In the absence of reflective materials 1046A and 1046B, radiation rays from the sides 1052 and 1054 may be extracted through walls 1040 and 1042 of optic device 1008 and reflect off of reflective surfaces 1036. Some of the radiation reflected from reflective surfaces 1036 may be directed so that they impinge on down conversion material 1010. Other radiation reflected from reflective surfaces 1036 may not be directed. Instead, for example, some reflected radiation may be directed toward and through spaces 1060 and 1062 between down conversion material 1010 and reflective surfaces 1036. Any radiation that is reflected toward and through spaces 1060 and 1062 will not be converted into white light by down conversion material 1010.

When reflective material 1046 is placed on the bottom portion of optic device 1008, radiation emitted from sides 1052 and 1054 of radiation source 1032 may be directed toward, and impinge upon, down conversion material by reflective material 1046. FIG. 18 shows exemplary radiation rays 1070 and 1072 that may be reflected by reflective materials 1046A, 1046B when exemplary radiation rays 1056 and 1058 impinge on reflective materials 1046A, 1046B. It will be understood that short wavelength radiation rays, in addition to exemplary reflected radiation rays 1070 and 1072, may be emitted from sides 1052 and 1054 and may be reflected by reflective materials 1046A, 1046B toward down conversion material 1010.

It will be understood that a thickness of reflective materials 1046A, 1046B has been exaggerated for purposes of illustration. In an exemplary embodiment, the thickness of reflective materials 1046A, 1046B may be much thinner relative to the other elements illustrated in FIGS. 17 and 18. In an exemplary embodiment, as illustrated in FIGS. 17 and 18, reflective materials 1046A, 1046B may be disposed along the outside of walls 1040 and 1042, respectively. In an alternative embodiment, reflective materials 1046A, 1046B may be embedded within walls 1040 and 1042, respectively. In another alternative embodiment, reflective materials 1046A, 1046B may be disposed along an inside surface of walls 1040 and 1042, respectively.

Referring to FIGS. 17 and 18, a length 1047 of reflective material 1046A, 1046B may be up to 90% of the length of walls 1040 and 1042, respectively. As shown in FIG. 18, an exemplary embodiment of reflective materials 1046A, 1046B may extend from a point that is adjacent the bottom 1051 of radiation source 1032 to respective end points 1049A, 1049B of reflective materials 1046A, 1046B that are beyond the top 1050 of radiation source 1032 and below end 1016 of optic device 1008. In an alternative embodiment, the length 1047 of reflective material 1046 may result in end points 1049A, 1049B of one or both of reflective materials 1046A, 1046B being equal to, beyond, or under the height 1033 of radiation source 1032 so that different amount of radiation emitted from sides 1052 and 1054 hits the down conversion material 1010 depending on the length 1047. That is, lengths of reflective materials 1046A and 1046B may be the same or they may be different and the respective lengths of reflective materials 1046A and 1046B may be symmetric or not symmetric.

In this embodiment, the first portion of walls 1040, 1042 between end points 1049A, 1049B of reflective materials 1046A, 1046B and end 1016 of optic device 1008 may be substantially light transmissive. Because of the presence of reflective materials 1046A, 1046B, the second portion of walls 1040, 1042 between the bottom 1051 of radiation source 1032 and end points 1049A, 1049B may not be substantially light transmissive. Instead, the second portion of walls 1040, 1042 may be substantially reflective.

Another advantage of using reflective materials 1046A, 1046B may be a reduction of a cost to manufacture an optic device such as optic device 1008. If walls 1040, 1042 of optic device 1008 are substantially light transmissive over their entire length, the walls 1040, 1042 may have to be highly polished along their entire length in order to use principles of TIR. When reflective materials 1046A, 1046B are applied to the bottom portion of the optic device, the cost of manufacturing optic device may be reduced because it may not be necessary to highly polish reflective walls 1040 and 1042 along their entire length. Instead, it may be necessary to highly polish only those portions of reflective walls 1040 and 1042 that do have reflective material 1046A, 1046B. Referring to FIG. 18, when reflective materials 1046A, 1046B are disposed on or in reflective walls 1040 and 1042, it may be necessary to highly polish reflective walls 1040 and 1042 only from end points 1049A, 1049B of reflective materials 1046A, 1046B to end 1016 of optic device 1008. The remainder of walls 1040 and 1042 that coincide with length 1047 of reflective materials 1046A, 1046B may have surfaces that are more rough than the surfaces between end points 1049A, 1049B and end 1016 of optic device 1008. Reducing the amount of polishing that may be performed on optic device 1008 may substantially reduce the cost of manufacturing optic device 1008.

Figure 19:
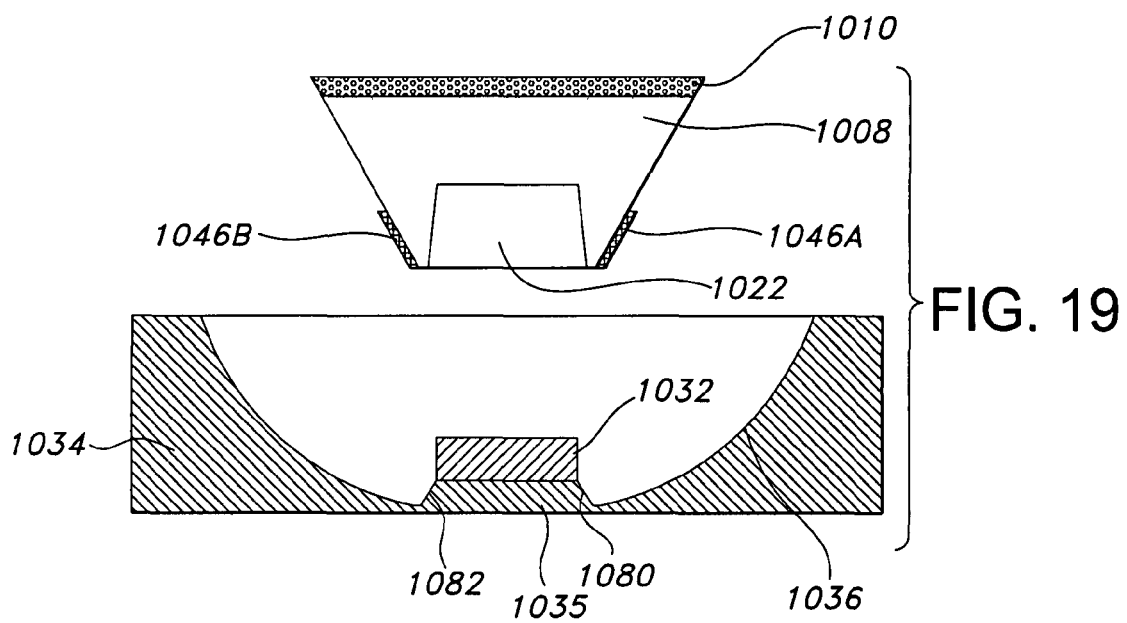
FIG. 19 is a partial cross-section view of still another embodiment of the invention.
Figure 20:
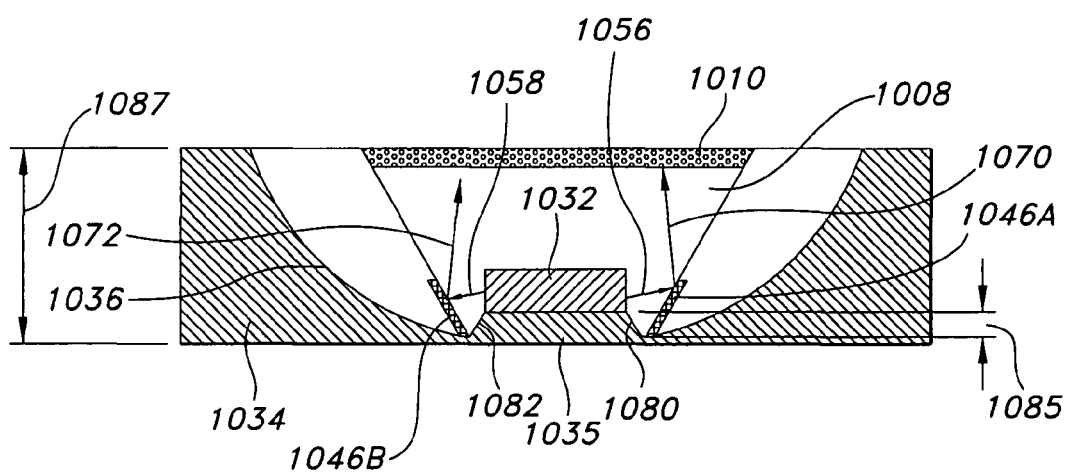
FIG. 20 is another partial cross-section view of the embodiment illustrated in FIG. 19.

Still another embodiment of the invention is illustrated in FIGS. 19 and 20. FIG. 19 is a partial cross-section view of this embodiment of the invention. FIG. 20 is another partial cross-section view of this embodiment illustrating an optic device being coupled to the other elements of the embodiment. The embodiment illustrated in FIGS. 19 and 20 is substantially the same as the embodiment that is illustrated in FIGS. 17 and 18.

The embodiment illustrated in FIGS. 19 and 20 may have an alternative embodiment of a heat sink 1034. In FIGS. 19 and 20, an alternative form of an aperture 1022 is illustrated. As explained in an earlier part of this application, alternative shapes of the aperture may be used. In this embodiment, heat sink 1034 has a raised portion 1035. The height 1085 of raised portion 1035 may be up to 50% of the height 1087 of heat sink 1034. Radiation source 1032 may be disposed on top of raised portion 1035. FIG. 20 illustrates exemplary radiation rays 1056, 1058 emitted from the sides of radiation source 1032 and being reflected toward down conversion material 1010 by reflective materials 1046A, 1046B as exemplary reflected lo radiation rays 1070, 1072. As explained previously, more or fewer radiation rays may be emitted from the sides of radiation source 1032 and reflected toward down conversion material 1010 by reflective materials 1046A, 1046B.

In the embodiment illustrated in FIG. 20, the aperture may cover the entire radiation source 1032 and substantially all of the raised portion 1035 of heat sink 1034. In addition, sides 1080, 1082 of raised portion 1035 may have reflective surfaces on them. The aperture may also cover reflective surfaces 1080, 1082. In other words, radiation source 1032 may be fully immersed within the aperture and the raised portion 1035 may be at least partially immersed in the aperture.

An advantage of the embodiment illustrated in FIG. 20 is that it may reduce the amount of radiation that may be reflected back toward radiation source 1034 because there may be a greater volume of space between the sides of radiation source 1034 and the reflective materials 1046A, 1046B.

Figure 21:
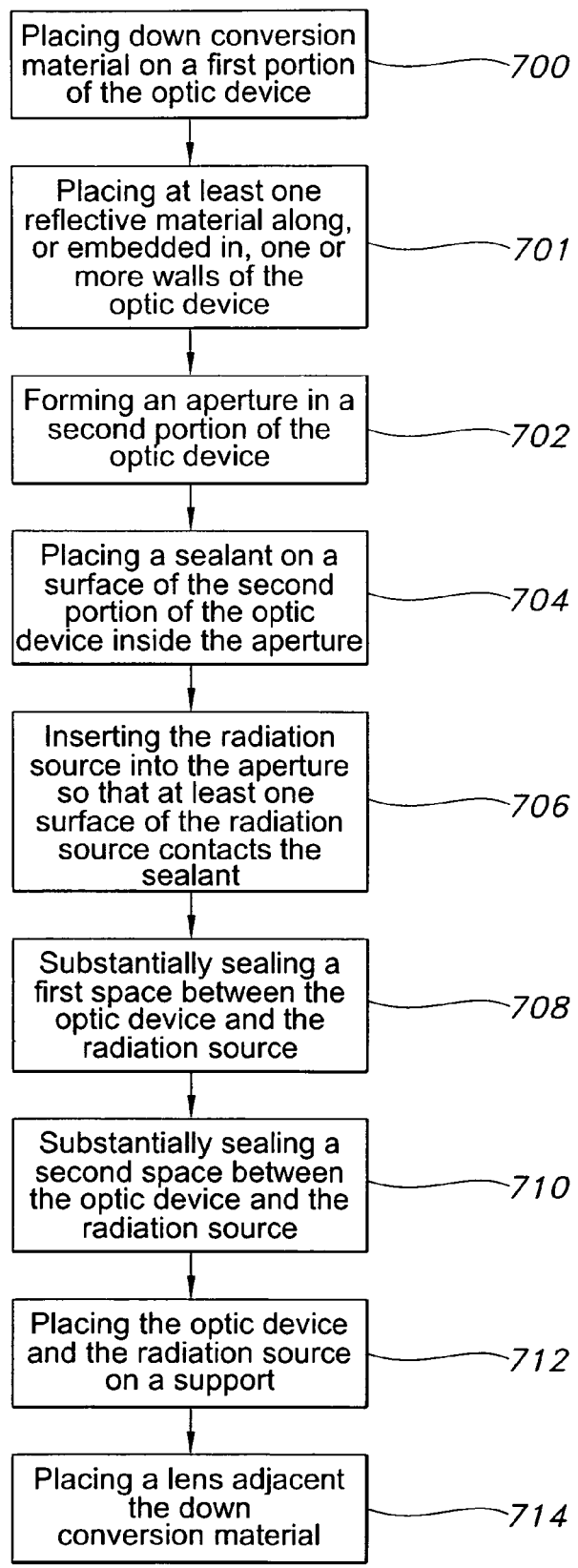
FIG. 21 illustrates an exemplary embodiment of a method of manufacturing either of the embodiments illustrated in FIGS. 17-20.
Figure 22:
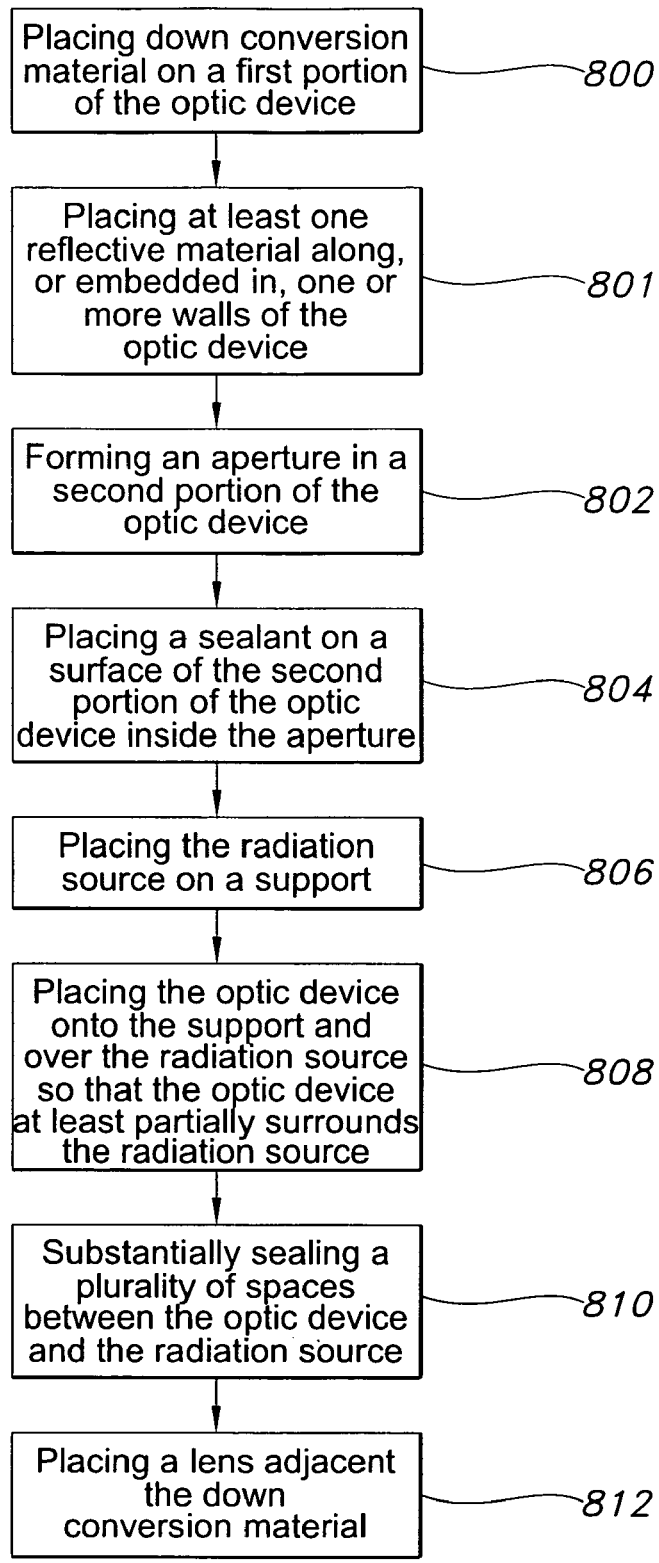
FIG. 22 illustrates another embodiment of a method of manufacturing either of the embodiments illustrated in FIGS. 17-20.

FIGS. 21 and 22 illustrate exemplary and alternative embodiments of methods that may be used to manufacture the embodiments illustrated in FIGS. 17-20. The method illustrated in FIG. 21 is the same method that has been illustrated in FIG. 14 with the inclusion of an additional step shown in Block 701. The step shown in Block 701 involves placing reflective material along, or embedded in, one or more walls of the optic device. As illustrated, the step in Block 701 may be performed after the step shown in Block 700 and before the step shown in Block 702. However, it will be understood that the steps illustrated in Blocks 700, 701, and 702 may be performed in any order.

The method illustrated in FIG. 22 is the same method that has been illustrated in FIG. 15 with the inclusion of an additional step shown on Block 801. The step shown in Block 801 involves placing reflective material along, or embedded in, one or more walls of the optic device. As illustrated, the step in Block 801 may be performed after the step shown in Block 800 and before the step shown in Block 802. However, it will be understood that the steps illustrated in Blocks 800, 801, and 802 may be performed in any order.

In all of the methods of manufacture described in this application, it will be understood that the short wavelength radiation source used in each of the various manufacturing processes does not have a dome. In order to obtain a short wavelength radiation source without a dome, a user may purchase it without the dome or may purchase it with a dome and then remove the dome as an additional step in the manufacturing process.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A light emitting apparatus comprising:
   an optic device having a top surface, a bottom surface, and at least one substantially transparent sidewall extending between the top surface and the bottom surface;
   a radiation source for emitting short wavelength radiation, the radiation source disposed adjacent the bottom surface of the optic device;
   a down conversion material, disposed on the top surface of the optic device and extending from the at least one transparent sidewall, receiving and down converting at least some of the short wavelength radiation emitted by the radiation source and back transferring a portion of the received and down converted radiation;
   the optic device disposed between the down conversion material and the radiation source and configured to pass radiation back-transferred from the down conversion material outside of the optic device through the at least one substantially transparent sidewall;
   a first reflective surface at least partially surrounding the optic device for reflecting at least some of the radiation extracted from the optic device through the at least one substantially transparent sidewall; and a second reflective surface at least partially surrounding the radiation source for reflecting at least some of the radiation emitted by the radiation source toward the down conversion material, an upper end of the second reflective surface extending from a bottom of the first reflective surface.

2. The light emitting apparatus of claim 1, further comprising a well adjacent the optic device, the radiation source being disposed in the well.

3. The light emitting apparatus of claim 2, wherein the second reflective surface forms a portion of the well.

4. The light emitting apparatus of claim 1, wherein the second reflective surface is adjacent the first reflective surface.

5. The light emitting apparatus of claim 1, wherein the first reflective surface and the second reflective surface are formed on a support structure.

6. The light emitting apparatus claim 5, wherein the radiation source is disposed on the support structure.

7. The light emitting apparatus of claim 6, wherein the support structure is a heat sink.

8. The light emitting apparatus of claim 1, further comprising a sealant disposed at least in a space between the radiation source and the optic device.

9. The light emitting apparatus of claim 1, further comprising a sealant disposed at least in a space between the second reflective surface and the radiation source.

10. The light emitting apparatus of claim 1, wherein the first reflective surface comprises a reflective cup having at least one radius of curvature.

11. The light emitting apparatus of claim 1, wherein the first reflective surface comprises a reflective cup having at least a first radius of curvature and a second radius of curvature.

12. The light emitting apparatus of claim 1, wherein the optic device is further configured to pass radiation from the radiation source through the at least one transparent sidewall.

13. The light emitting apparatus of claim 1, wherein the first reflective surface is spaced away from the optic device.

14. A light emitting apparatus comprising:
an optic device having a top surface, a bottom surface, and at least one substantially transparent sidewall extending between the top surface and the bottom surface;
a radiation source for emitting short wavelength radiation, the radiation source disposed adjacent the bottom surface of the optic device;
a down conversion material, disposed on the top surface of the optic device and extending from the at least one transparent sidewall, receiving and down converting at least some of the short wavelength radiation emitted by the radiation source and back transferring a portion of the received and down converted radiation;
the optic device disposed between the down conversion material and the radiation source and configured to receive at least a portion of the radiation back-transferred from the down conversion material and to transfer at least some of the received portion of back-transferred radiation outside the optic device through the at least one substantially transparent sidewall;
a first reflective surface at least partially surrounding the optic device for reflecting at least some of the radiation back-transferred outside the optic device through the at least one substantially transparent sidewall; and
a second reflective surface at least partially surrounding the radiation source for reflecting at least some of the radiation emitted by the radiation source toward the down conversion material, an upper end of the second reflective surface extending from a bottom of the first reflective surface.

15. The light emitting apparatus of claim 14, wherein the first reflective surface is spaced away from the optic device.

* * * * *